(12) United States Patent
Ko et al.

(10) Patent No.: US 12,495,678 B2
(45) Date of Patent: Dec. 9, 2025

(54) THIN FILM TRANSISTOR, THIN FILM TRANSISTOR SUBSTRATE AND DISPLAY APPARATUS

(71) Applicant: LG Display Co., Ltd., Seoul (KR)

(72) Inventors: Younghyun Ko, Paju-si (KR); ChanYong Jeong, Paju-si (KR); KyungChul Ok, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 659 days.

(21) Appl. No.: 17/975,402

(22) Filed: Oct. 27, 2022

(65) Prior Publication Data
US 2023/0165057 A1 May 25, 2023

(30) Foreign Application Priority Data
Nov. 19, 2021 (KR) .......... 10-2021-0159910

(51) Int. Cl.
*H10D 86/60* (2025.01)
*H10D 30/67* (2025.01)
(Continued)

(52) U.S. Cl.
CPC ....... *H10K 59/1213* (2023.02); *H10K 59/126* (2023.02); *H10D 30/6713* (2025.01); *H10D 30/6723* (2025.01); *H10D 30/6733* (2025.01); *H10D 30/6755* (2025.01); *H10D 64/62* (2025.01); *H10D 86/423* (2025.01); *H10D 86/60* (2025.01)

(58) Field of Classification Search
CPC .. H10K 59/1213; H10K 59/126; H10K 59/12; H10D 30/6713; H10D 30/6723; H10D 30/6733; H10D 30/6755; H10D 64/62; H10D 86/423; H10D 86/60; H10D 30/6757; H10D 86/431; H10D 86/441
USPC .......................................................... 257/40
See application file for complete search history.

(56) References Cited

U.S. PATENT DOCUMENTS 6,380,558 B1 * 4/2002 Yamazaki .......... H10D 30/0316
257/E21.414
2002/0009833 A1 1/2002 Lin et al.
(Continued)

FOREIGN PATENT DOCUMENTS

EP 0570257 A1 11/1993
JP 2002-050770 A 2/2022
(Continued)

OTHER PUBLICATIONS

Combined Search and Examination Report issued in corresponding UK Patent Application No. GB2215390.2 dated May 8, 2024.
(Continued)

*Primary Examiner* — Monica D Harrison
(74) *Attorney, Agent, or Firm* — Morgan, Lewis & Bockius LLP

(57) ABSTRACT

A thin film transistor, a thin film transistor substrate including the thin film transistor and a display device are provided. The thin film transistor includes a first active layer, a first auxiliary gate electrode and a first gate electrode, wherein the first active layer includes a first channel portion, a first connection portion that is in contact with one side of the first channel portion, and a second connection portion that is in contact with the other side of the first channel portion.

18 Claims, 23 Drawing Sheets

(51) Int. Cl.
    *H10K 59/121*    (2023.01)
    *H10K 59/126*    (2023.01)
    *H10D 64/62*    (2025.01)
    *H10D 86/40*    (2025.01)

(56) References Cited

U.S. PATENT DOCUMENTS

| | | |
|---|---|---|
| 2004/0195568 A1 | 10/2004 | Okumura |
| 2008/0296652 A1 | 12/2008 | Forbes |
| 2014/0353605 A1 | 12/2014 | Kim et al. |
| 2015/0123084 A1 | 5/2015 | Kim et al. |
| 2016/0148986 A1 | 5/2016 | Lee et al. |
| 2016/0225864 A1 | 8/2016 | Strassburg et al. |
| 2021/0193804 A1 | 6/2021 | Cho et al. |
| 2021/0193838 A1 | 6/2021 | Ko |
| 2021/0313470 A1 | 10/2021 | Ji et al. |

FOREIGN PATENT DOCUMENTS

| | | |
|---|---|---|
| KR | 10-2014-0141333 A | 12/2014 |
| KR | 10-2021-0081623 A | 7/2021 |

OTHER PUBLICATIONS

Combined Search and Examination Report dated Apr. 18, 2023, issued in corresponding UK Patent Application No. GB2215390.2.
Office Action issued in corresponding Korean Patent Application No. 10-2021-0159910, dated Dec. 2, 2024.
German Office Action issued in corresponding DE Patent Application No. 10 2022 128 685.1 dated May 19, 2023.

\* cited by examiner

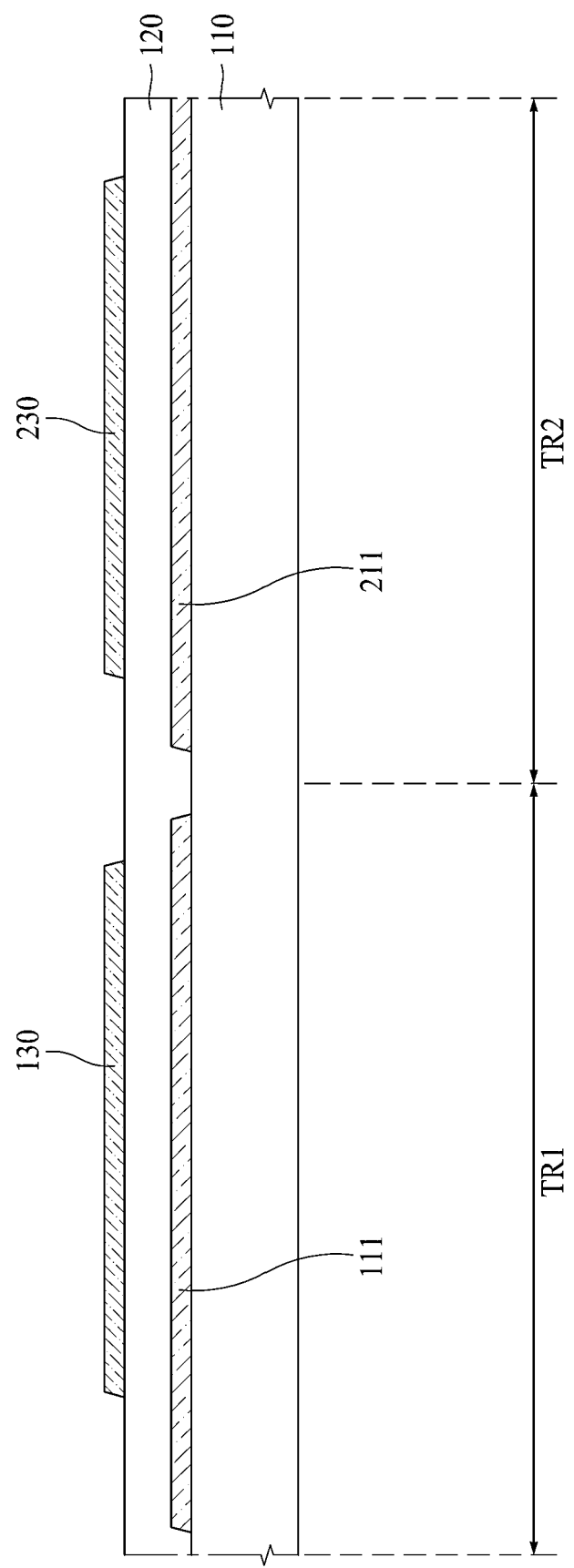

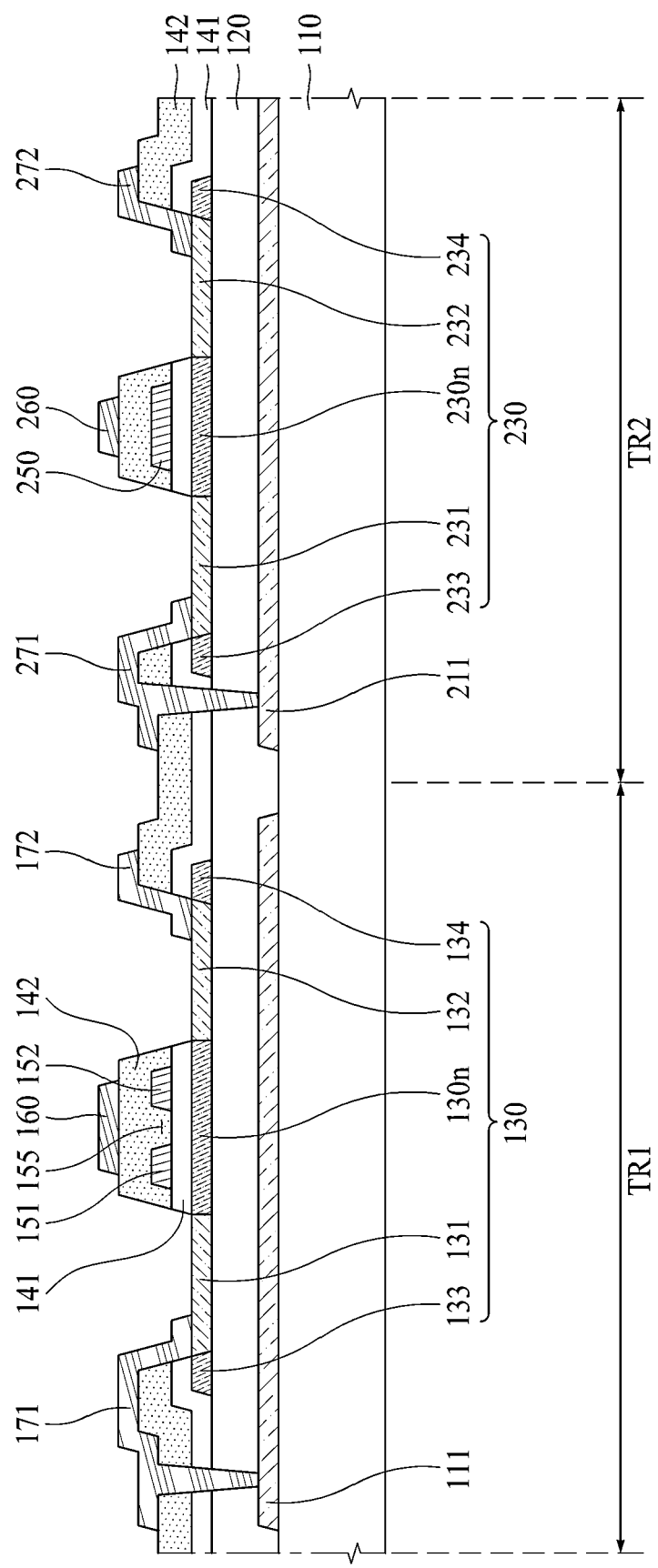

THIN FILM TRANSISTOR, THIN FILM TRANSISTOR SUBSTRATE AND DISPLAY APPARATUS

CROSS-REFERENCE TO RELATED APPLICATIONS

This application claims the benefit of priority of the Korean Patent Application No. 10-2021-0159910 filed on Nov. 19, 2021.

BACKGROUND

Technical Field

One embodiment of the present disclosure relates to a thin film transistor, a thin film transistor substrate and a display device, and more particularly, to a thin film transistor comprising an auxiliary gate electrode, a thin film transistor substrate comprising the thin film transistor, and a display device comprising the thin film transistor substrate.

Discussion of the Related Art

Since a thin film transistor can be fabricated on a glass substrate or a plastic substrate, the thin film transistor is widely used as a switching device of a display device such as a liquid crystal display device or an organic light emitting device.

The thin film transistor may be categorized into an amorphous silicon thin film transistor in which amorphous silicon is used as an active layer, a polycrystalline silicon thin film transistor in which polycrystalline silicon is used as an active layer, and an oxide semiconductor thin film transistor in which an oxide semiconductor is used as an active layer, based on a material constituting the active layer.

Among thin film transistors, since the oxide semiconductor thin film transistor (TFT) may have high mobility and have a large resistance change in accordance with an oxygen content, it has an advantage in that desired properties may be easily obtained. Further, since an oxide constituting an active layer may be grown at a relatively low temperature during a process of fabricating the oxide semiconductor thin film transistor, the fabricating cost of the oxide semiconductor thin film transistor is reduced. In view of the properties of oxide, since an oxide semiconductor is transparent, it is favorable to embody a transparent display device.

A display device may include a switching thin film transistor and a driving thin film transistor. Generally, it is advantageous that the switching thin film transistor has a small s-factor to improve on-off characteristics, and the driving thin film transistor has a large s-factor to express a gray scale. However, since thin film transistors generally have a small s-factor to make sure of on-off characteristics, when such thin film transistors are applied to the driving thin film transistor of the display device, it is difficult to express a gray scale.

Therefore, a thin film transistor having a large s-factor is required to easily express a gray scale by being applied to the driving thin film transistor of the display device. Also, even though the thin film transistor has a large s-factor, it is required to have excellent current characteristics in an ON-state.

SUMMARY

Accordingly, embodiments of the present disclosure are directed to a thin film transistor, a thin film transistor substrate, and a display device that substantially obviates one or more of the problems due to limitations and disadvantages of the related art.

An aspect of the present disclosure is to provide a thin film transistor that has a large s-factor, and has excellent current characteristics in an ON-state. In more detail, one embodiment of the present disclosure is to provide a thin film transistor that has a large s-factor and has a large current value in an ON-state.

Another aspect of the present disclosure is to provide a thin film transistor that has a large s-factor and has excellent current characteristics at an ON-period due to a difference in an electric field effect between a portion in which an auxiliary gate electrode is disposed and a portion in which the auxiliary gate electrode is not disposed.

Another aspect of the present disclosure is to provide a thin film transistor substrate comprising the above thin film transistor.

Another aspect of the present disclosure is to provide a display device that has excellent gray scale expression capability and excellent current characteristics by using a thin film transistor having a large s-factor and large ON-current characteristics as a driving transistor.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a thin film transistor comprises a first active layer, a first gate electrode at least partially overlapped with the first active layer, and a first auxiliary gate electrode and a second auxiliary gate electrode between the first active layer and the first gate electrode, wherein the first active layer includes a first channel portion, a first connection portion that is in contact with a side of the first channel portion, and a second connection portion that is in contact with the other side of the first channel portion, wherein the first channel portion overlaps the first auxiliary gate electrode, the second auxiliary gate electrode and the first gate electrode, the first auxiliary gate electrode and the second auxiliary gate electrode are spaced apart from each other on the first channel portion and overlap the first gate electrode, respectively, and the first channel portion overlaps a gap space between the first auxiliary gate electrode and the second auxiliary gate electrode. Gap space may be considered to be a gap.

The thin film transistor may further comprise a first gate insulating layer between the first auxiliary gate electrode and the second auxiliary gate electrode and the first active layer, and a second gate insulating layer between the first auxiliary gate electrode and the second auxiliary gate electrode and the first gate electrode, wherein the first connection portion and the second connection portion may be exposed from the first gate insulating layer and the second gate insulating layer, respectively.

The first auxiliary gate electrode, the second auxiliary gate electrode and the first gate electrode are configured to be applied with a same voltage.

The first auxiliary gate electrode may overlap the first channel portion in a direction of the first connection portion, and the second auxiliary gate electrode may overlap the first channel portion in a direction of the second connection portion. That is to say that the first auxiliary gate electrode may overlap the first channel portion at a side of the first channel portion nearest the first connection portion, and the second auxiliary gate electrode may overlap the first channel portion at a side of the first channel portion nearest the second connection portion.

The gap space between the first auxiliary gate electrode and the second auxiliary gate electrode may fully overlap the first gate electrode on the first channel portion.

The first active layer may include a first semiconductor portion that is in contact with the first connection portion, the first connection portion may be disposed between the first channel portion and the first semiconductor portion and exposed from the first gate insulating layer, and the first semiconductor portion may be covered by the first gate insulating layer.

The thin film transistor may further comprise a first electrode disposed on the same layer as the first gate electrode to contact the first connection portion, wherein the first semiconductor portion may overlap the first electrode.

The first active layer may include a second semiconductor portion that is in contact with the second connection portion, the second connection portion may be disposed between the first channel portion and the second semiconductor portion and exposed from the first gate insulating layer, and the second semiconductor portion may be covered by the first gate insulating layer.

The thin film transistor may further comprise a second electrode disposed on the same layer as the first gate electrode to contact the second connection portion, wherein the second semiconductor portion may overlap the second electrode.

The thin film transistor may further comprise a conductive material layer disposed on at least one of the first connection portion or the second connection portion, wherein the conductive material layer may not overlap the first channel portion.

The conductive material layer includes at least one selected from titanium (Ti), molybdenum (Mo), aluminum (Al), silver (Ag), copper (Cu), chromium (Cr), tantalum (Ta), neodymium (Nd), calcium (Ca), barium (Ba) or a transparent conductive oxide (TCO).

In another aspect, a thin film transistor comprises a first active layer, a first gate insulating layer on the first active layer, a first auxiliary gate electrode on the first gate insulating layer, a second gate insulating layer on the first auxiliary gate electrode, and a first gate electrode on the second gate insulating layer, wherein the first active layer may include a first channel portion, a first connection portion that is in contact with a side of the first channel portion, a first semiconductor portion that is in contact with the first connection portion, a second connection portion that is in contact with the other side of the first channel portion, and a second semiconductor portion that is in contact with the second connection portion, wherein the first connection portion is disposed between the first channel portion and the first semiconductor portion, the second connection portion is disposed between the first channel portion and the second semiconductor portion, the first connection portion and the second connection portion are exposed from the first gate insulating layer and the second gate insulating layer, respectively, and the first semiconductor portion and the second semiconductor portion are covered by the first gate insulating layer and the second gate insulating layer, respectively.

The first auxiliary gate electrode may overlap the first gate electrode, and the first channel portion may include an area that overlaps the first gate electrode and does not overlap the first auxiliary gate electrode.

The first auxiliary gate electrode may overlap the first channel portion in a direction of the first connection portion. That is to say that the first auxiliary gate electrode may overlap the first channel portion at a side of the first channel portion nearest the first connection portion.

The first auxiliary gate electrode may overlap the first channel portion in a direction of the second connection portion. That is to say that the first auxiliary gate electrode may overlap the first channel portion at a side of the first channel portion nearest the second connection portion.

The thin film transistor may further comprise a first electrode disposed on the same layer as the first gate electrode to contact the first connection portion, and a second electrode spaced apart from the first electrode and disposed on the same layer as the first gate electrode to contact the second connection portion.

The first semiconductor portion may overlap the first electrode, and the second semiconductor portion may overlap the second electrode.

In still another aspect, a thin film transistor substrate comprises a first thin film transistor and a second thin film transistor on a base substrate, wherein the first thin film transistor includes a first active layer having a first channel portion, a first auxiliary gate electrode on the first active layer, and a first gate electrode on the first auxiliary gate electrode, the second thin film transistor includes a second active layer having a second channel portion, and a second gate electrode that overlaps the second channel portion, wherein the first auxiliary gate electrode is disposed between the first active layer and the first gate electrode and overlaps a portion of the first channel portion and a portion of the first gate electrode, and the second gate electrode is disposed on the same layer as the first auxiliary gate electrode.

The first active layer may include a first connection portion that is in contact with a side of the first channel portion, and a second connection portion that is in contact with the other side of the first channel portion, the second active layer may include a third connection portion that is in contact with one side of the second channel portion, and a fourth connection portion that is in contact with the other side of the second channel portion.

The thin film transistor substrate may further comprise a first gate insulating layer disposed between the first active layer and the first auxiliary gate electrode and between the second active layer and the second gate electrode, and a second gate insulating layer disposed between the first auxiliary gate electrode and the first gate electrode, wherein the first connection portion, the second connection portion, the third connection portion and the fourth connection portion may be exposed from the first gate insulating layer and the second gate insulating layer, respectively.

The first active layer may include a first semiconductor portion spaced apart from the first channel portion to contact the first connection portion and a second semiconductor portion spaced apart from the first channel portion to contact the second connection portion, the second active layer may include a third semiconductor portion spaced apart from the second channel portion to contact the third connection portion and a fourth semiconductor portion spaced apart from the second channel portion to contact the fourth connection portion, and the first semiconductor portion, the second semiconductor portion, the third semiconductor portion and the fourth semiconductor portion may be covered by the first gate insulating layer, respectively.

The thin film transistor substrate may further comprise a first electrode disposed on the same layer as the first gate electrode to contact the first connection portion, a second electrode spaced apart from the first electrode and disposed on the same layer as the first gate electrode to contact the first connection portion, a third electrode disposed on the same layer as the first gate electrode to contact the third connection portion, and a fourth electrode spaced apart from the third electrode and disposed on the same layer as the first gate electrode to contact the fourth connection portion, wherein the first semiconductor portion may overlap the first electrode, the second semiconductor portion may overlap the second electrode, the third semiconductor portion may overlap the third electrode, and the fourth semiconductor portion may overlap the fourth electrode.

The thin film transistor may further include a second auxiliary gate electrode spaced apart from the first auxiliary gate electrode and disposed on the same layer as the first auxiliary gate electrode, the first auxiliary gate electrode and the second auxiliary gate electrode may overlap the first channel portion and the first gate electrode, respectively, and the first channel portion may overlap a gap space between the first auxiliary gate electrode and the second auxiliary gate electrode.

The thin film transistor substrate may further comprise a conductive material layer disposed on the first connection portion, the second connection portion, the third connection portion and the fourth connection portion.

At least one of the first active layer or the second active layer may include an oxide semiconductor material.

The oxide semiconductor material may include at least one of an IZO(InZnO)-based, IGO(InGaO)-based, ITO(InSnO)-based, IGZO(InGaZnO)-based, IGZTO(InGaZnSnO)-based, GZTO(GaZnSnO)-based, GZO(GaZnO)-based, ITZO(InSnZnO)-based or FIZO(FeInZnO)-based oxide semiconductor material.

At least one of the first active layer or the second active layer may include a first oxide semiconductor layer, and a second oxide semiconductor layer on the first oxide semiconductor layer.

At least one of the first active layer or the second active layer may further include a third oxide semiconductor layer on the second oxide semiconductor layer.

In accordance with further still another aspect of the present disclosure, the above and other objects can be accomplished by the provision of a display device comprising the above thin film transistor.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings:

FIGS. 15A to 15F are schematic views illustrating a fabricating process of a thin film transistor substrate according to another embodiment of the present disclosure;

DETAILED DESCRIPTION

Figure 1A:
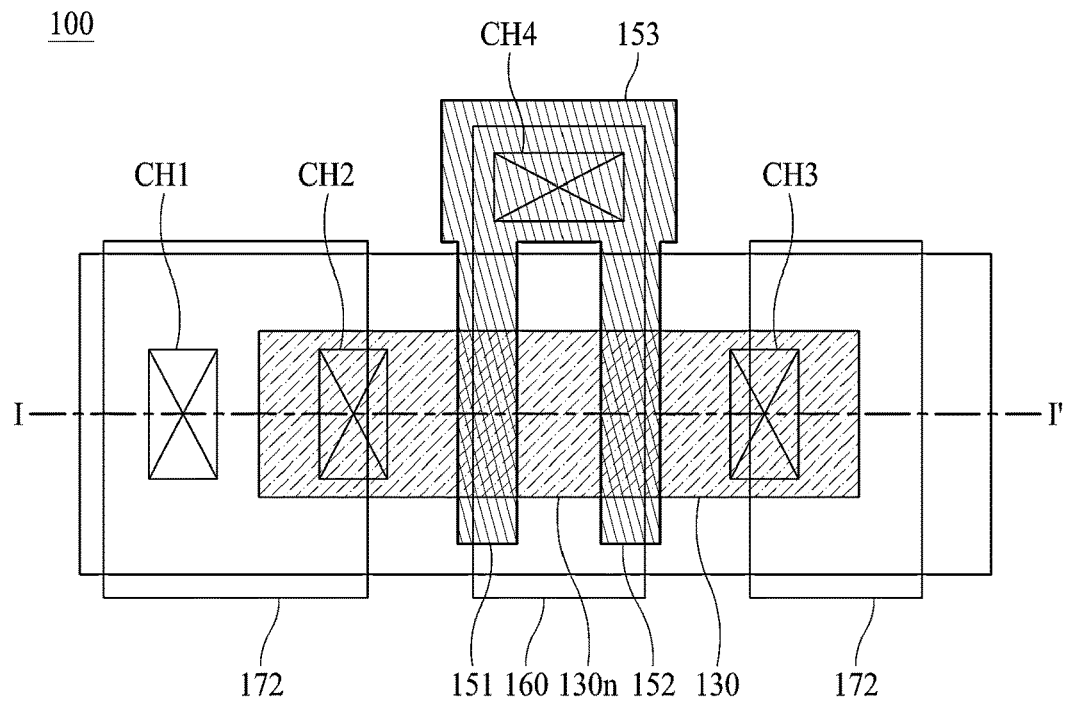
FIG. 1A is a plan view illustrating a thin film transistor according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

Spatially relative terms such as "below", "beneath", "lower", "above", and "upper" may be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below", or "beneath" another device may be arranged "above" another device. Therefore, an exemplary term "below or beneath" may include "below or beneath" and "above" orientations. Likewise, an exemplary term "above" or "on" may include "above" and "below or beneath" orientations.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present invention.

The term "at least one" should be understood as including any and all combinations of one or more of the associated listed items. For example, the meaning of "at least one of a first items, a second item, and a third item" denotes the combination of all items proposed from one or more of the first items, the second item, and the third item as well as one or more of the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

In the drawings, the same or similar elements are denoted by the same reference numerals even though they are depicted in different drawings.

In the embodiments of the present disclosure, a source electrode and a drain electrode are distinguished from each other, for convenience of description. However, the source electrode and the drain electrode may be used interchangeably. The source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In some embodiments of the present disclosure, for convenience of description, a source region is distinguished from a source electrode, and a drain region is distinguished from a drain electrode. However, the embodiments of the present disclosure are not limited to this structure. For example, a source region may be a source electrode, and a drain region may be a drain electrode. Also, a source region may be a drain electrode, and a drain region may be a source electrode.

Figure 1B:
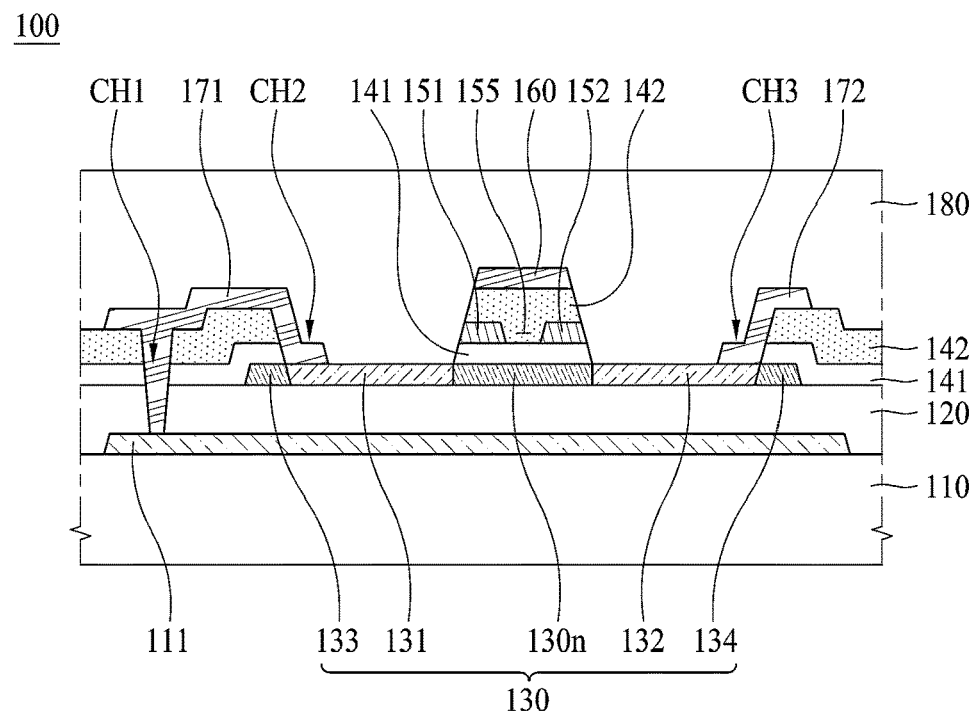
FIG. 1B is a cross-sectional view taken along line I-I' of FIG. 1A.

FIG. 1A is a plan view illustrating a thin film transistor according to one embodiment of the present disclosure, and FIG. 1B is a cross-sectional view taken along line I-I' of FIG. 1A.

Referring to FIGS. 1A and 1B, a thin film transistor 100 according to one embodiment of the present disclosure includes a first active layer 130, a first gate electrode 160 that at least partially overlaps the first active layer 130, and first and second auxiliary gate electrodes 151 and 152 between the first active layer 130 and the first gate electrode 160.

Referring to FIG. 1B, the thin film transistor 100 according to one embodiment of the present disclosure is disposed on a base substrate 110.

Glass or plastic may be used as the base substrate 110. A transparent plastic having a flexible property, for example, polyimide may be used as the plastic. When polyimide is used as the base substrate 110, a heat-resistant polyimide capable of enduring a high temperature may be used considering that a high temperature deposition process is performed on the base substrate 110.

Referring to FIG. 1B, a first light shielding layer 111 may be disposed on the base substrate 110. The first light shielding layer 111 may be made of a material having light shielding characteristics. The first light shielding layer 111 shields light incident from the outside to protect the first active layer 130.

The first light shielding layer 111 may be omitted. Although not shown in FIG. 1B, a lower buffer layer may be disposed between the base substrate 110 and the first light shielding layer 111.

A buffer layer 120 is disposed on the first light shielding layer 111. The buffer layer 120 may include at least one of a silicon oxide, a silicon nitride or a metal-based oxide. According to one embodiment of the present disclosure, the buffer layer 120 may include at least one of a silicon oxide or a silicon nitride. The buffer layer 120 may have a single layered structure, or may have a multi-layered structure.

The buffer layer 120 protects the first active layer 130. The first light shielding layer 111 is disposed on an upper surface of the base substrate 110. An upper surface of the buffer layer 120 may be flat to provide a uniform surface for the structure of the TFT.

The first active layer 130 is disposed on the buffer layer 120.

The first active layer 130 may include a semiconductor material. In more detail, the first active layer 130 may include an oxide semiconductor material.

According to one embodiment of the present disclosure, the oxide semiconductor material may include at least one of, for example, an IZO(InZnO)-based, IGO(InGaO)-based, ITO(InSnO)-based, IGZO(InGaZnO)-based, IGZTO (InGaZnSnO)-based, GZTO(GaZnSnO)-based, GZO(GaZnO)-based, ITZO(InSnZnO)-based or FIZO(FeInZnO)-based oxide semiconductor material, but one embodiment of the present disclosure is not limited thereto, and the first active layer 130 may be made of another oxide semiconductor material known in the art.

The first active layer 130 includes a first channel portion 130n, a first connection portion 131 and a second connection portion 132. Referring to FIG. 1B, the first connection portion 131 is in contact with one side of the first channel portion 130n, and the second connection portion 132 is in contact with the other side of the first channel portion 130n.

The first connection portion 131 and the second connection portion 132 may be formed by selective conductorization for the first active layer 130. Providing conductivity to a selected part of active layer 130 is referred to as a selective conductorization. Selective conductorization can be performed by doping, plasma treatment, or the like. The first connection portion 131 and the second connection portion 132 are also referred to as conductorization portions.

According to one embodiment of the present disclosure, the first connection portion 131 of the first active layer 130 may be a first source area, and the second connection portion 132 may be a first drain area, but one embodiment of the present disclosure is not limited thereto. The first connection portion 131 may be a first drain area, and the second connection portion 132 may be a first source area.

A first gate insulating layer 141 is disposed on the first active layer 130. The first gate insulating layer 141 protects the first channel portion 130n.

The first gate insulating layer 141 may include at least one of a silicon oxide, a silicon nitride or a metal-based oxide. The first gate insulating layer 141 may have a single layered structure, or may have a multi-layered structure.

Referring to FIG. 1B, the first gate insulating layer 141 may have a patterned structure. That is to say that some of the first gate insulating layer 141 has been removed.

The first auxiliary gate electrode 151 and the second auxiliary gate electrode 152 are disposed on the first gate insulating layer 141. The first auxiliary gate electrode 151 and the second auxiliary gate electrode 152 overlap the first channel portion 130n of the first active layer 130.

Each of the first auxiliary gate electrode 151 and the second auxiliary gate electrode 152 may include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), neodymium (Nd) or titanium (Ti). Each of the first auxiliary gate electrode 151 and the second auxiliary gate electrode 152 may have a multi-layered structure that includes at least two conductive layers having their respective physical properties different from each other.

Referring to FIG. 1A, the first auxiliary gate electrode 151 and the second auxiliary gate electrode 152 are spaced apart from each other on the first channel portion 130n, and may be connected to each other by a pad electrode 153. The first auxiliary gate electrode 151 and the second auxiliary gate electrode 152 may have a branch shape extended from the pad electrode 153, for example. The first auxiliary gate electrode 151 and the second auxiliary gate electrode 152 may have an elongated shape extending from the pad electrode 153.

A second gate insulating layer 142 is disposed on the first auxiliary gate electrode 151 and the second auxiliary gate electrode 152. The second gate insulating layer 142 may include at least one of a silicon oxide, a silicon nitride or a metal-based oxide. The second gate insulating layer 142 may have a single layered structure, or may have a multi-layered structure.

The first gate electrode 160 is disposed on the second gate insulating layer 142.

The first gate electrode 160 may include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), neodymium (Nd) or titanium (Ti). The first gate electrode 160 may have a multi-layered structure that includes at least two conductive layers having their respective physical properties different from each other.

The first gate electrode 160 may be made of the same material as that of each of the first auxiliary gate electrode 151 and the second auxiliary gate electrode 152, or may be made of a material different from that of each of the first auxiliary gate electrode 151 and the second auxiliary gate electrode 152.

Referring to FIG. 1A, the first gate electrode 160 may be connected to the pad electrode 153 through a contact hole CH4 and thus connected to the first auxiliary gate electrode 151 and the second auxiliary gate electrode 152. Therefore, the same voltage may be applied to the first gate electrode 160, the first auxiliary gate electrode 151 and the second auxiliary gate electrode 152. The voltage applied to the first gate electrode 160, the first auxiliary gate electrode 151 and the second auxiliary gate electrode 152 is referred to as a gate voltage.

According to one embodiment of the present disclosure, the first auxiliary gate electrode 151 may overlap the first channel portion 130n in a direction of the first connection portion 131, and the second auxiliary gate electrode 152 may overlap the first channel portion 130n in a direction of the second connection portion 132. In more detail, the first auxiliary gate electrode 151 may overlap an edge of the first channel portion 130n in the direction of the first connection portion 131, and the second auxiliary gate electrode 152 may overlap an edge of the first channel portion 130n in the direction of the second connection portion 132. That is to say that the first auxiliary gate electrode 151 may overlap the first channel portion 130n at a side of the first channel portion 130n nearest the first connection portion 131, and the second auxiliary gate electrode 152 may overlap the first channel portion 130n at a side of the first channel portion 130n nearest the second connection portion 132.

Referring to FIGS. 1A and 1B, the first auxiliary gate electrode 151 and the second auxiliary gate electrode 152 are spaced apart from each other on the first channel portion 130n to each at least partially overlap the first gate electrode 160, respectively. A gap space 155 is formed between the first auxiliary gate electrode 151 and the second auxiliary gate electrode 152.

The first channel portion 130n overlaps the first auxiliary gate electrode 151, the second auxiliary gate electrode 152 and the first gate electrode 160. When a voltage is applied to the first auxiliary gate electrode 151, the second auxiliary gate electrode 152 and the first gate electrode 160, a current may flow through the first channel portion 130n.

In addition, the first channel portion 130n overlaps the gap space 155 between the first auxiliary gate electrode 151 and the second auxiliary gate electrode 152. On the first channel portion 130n, the entire gap space 155 between the first auxiliary gate electrode 151 and the second auxiliary gate electrode 152 overlaps the first gate electrode 160. As a result, an electric field due to the gate voltage may be applied to the entire area of the first channel portion 130n.

The first auxiliary gate electrode 151 and the second auxiliary gate electrode 152 are disposed to be closer to the first channel portion 130n than the first gate electrode 160. Therefore, an electric field effect applied to the first channel portion 130n by the first auxiliary gate electrode 151 and the second auxiliary gate electrode 152 may be greater than that applied to the first channel portion 130n by the first gate electrode 160.

Referring to FIGS. 1A and 1B, the electric field effect by the first auxiliary gate electrode 151 and the second auxiliary gate electrode 152 is not applied to an area of the first channel portion 130n, which overlaps the gap space 155, and only the electric field effect by the first gate electrode 160 is applied thereto. Therefore, a relatively weak electric field is applied to an area of the first channel portion 130n, which does not overlap the first auxiliary gate electrode 151 and the second auxiliary gate electrode 152.

As described above, since the weak electric field is applied to a middle portion of the first channel portion 130n, a current change due to a voltage change for a threshold voltage of the thin film transistor 100 may be reduced. As a result, an s-factor of the thin film transistor 100 may be increased.

Referring to FIG. 1B, the first gate insulating layer 141 is disposed between the first auxiliary gate electrode 151 and the second auxiliary gate electrode 152 and the first active layer 130, and the second gate insulating layer 142 is disposed between the first auxiliary gate electrode 151 and the second auxiliary gate electrode 152 and the first gate electrode 160. The first connection portion 131 and the second connection portion 132 are exposed by the first gate insulating layer 141 and the second gate insulating layer 142, being patterned, respectively.

The first gate insulating layer 141 and the second gate insulating layer 142 may be patterned to expose the first connection portion 131 and the second connection portion 132. According to one embodiment of the present disclosure, in the process of patterning the first gate insulating layer 141 and the second gate insulating layer 142, the first active layer 130 may be selectively conductorized so that the first connection portion 131 and the second connection portion 132, which are the conductorization areas, may be formed.

The first gate insulating layer 141 and the second gate insulating layer 142 may be simultaneously patterned.

Referring to FIG. 1B, the first active layer 130 includes a first semiconductor portion 133 that is in contact with the first connection portion 131. The first connection portion 131 is disposed between the first channel portion 130n and the first semiconductor portion 133. The first semiconductor portion 133 is covered by the first gate insulating layer 141.

Referring to FIG. 1B, the first active layer 130 includes a second semiconductor portion 134 that is in contact with the second connection portion 132. The second connection portion 132 is disposed between the first channel portion 130n and the second semiconductor portion 134. The second semiconductor portion 134 is covered by the first gate insulating layer 141.

The thin film transistor 100 according to one embodiment of the present disclosure includes a first electrode 171 and a second electrode 172, which are disposed on the second gate insulating layer 142. The first electrode 171 may serve as a source electrode, and the second electrode 172 may serve as a drain electrode, but one embodiment of the present disclosure is not limited thereto. The first electrode 171 may serve as a drain electrode, and the second electrode 172 may serve as a source electrode. In addition, the first connection portion 131 and the second connection portion 132 serve as a source electrode and a drain electrode, respectively, and the first electrode 171 and the second electrode 172 may serve as connection electrodes between devices.

Referring to FIGS. 1A and 1B, the first electrode 171 is connected to the first light shielding layer 111 through a first contact portion CH1, and is connected to the first active layer 130 through a second contact portion CH2. The second electrode 172 is connected to the first active layer 130 through a third contact portion CH3.

In detail, the first electrode 171 is disposed on the same layer as the first gate electrode 160 to contact the first connection portion 131. Referring to FIG. 1B, the first electrode 171 is disposed on the second gate insulating layer 142 in the same manner as the first gate electrode 160 and extended along sides of the first gate insulating layer 141 and the second gate insulating layer 142, which are patterned, to contact the first connection portion 131.

The second electrode 172 is disposed on the same layer as the first gate electrode 160 to contact the second connection portion 132. The second electrode 172 is disposed to be spaced apart from the first electrode 171.

Referring to FIG. 1B, the second electrode 172 is disposed on the second gate insulating layer 142 in the same manner as the first gate electrode 160 and extended along the sides of the first gate insulating layer 141 and the second gate insulating layer 142, which are patterned, to contact the second connection portion 132.

The first electrode 171 and the second electrode 172 may be made of the same material as that of the first gate electrode 160, and may be formed together with the first gate electrode 160 by the same process.

According to one embodiment of the present disclosure, the first gate insulating layer 141 and the second gate insulating layer 142 are patterned to expose the first connection portion 131 and the second connection portion 132, and the first gate insulating layer 141 and the second gate insulating layer 142 are not removed at ends of the first active layer 130 so that the first electrode 171 serving as a source electrode and the second electrode 172 serving as a drain electrode may be stably in contact with the first connection portion 131 and the second connection portion 132, respectively.

Since the first gate insulating layer 141 and the second gate insulating layer 142 are not removed at the ends of the first active layer 130, even though a process error occurs, the first electrode 171 and the second electrode 172 may be extended along the sides of the first gate insulating layer 141 and the second gate insulating layer 142, respectively, to stably contact the first connection portion 131 and the second connection portion 132.

Since the first gate insulating layer 141 and the second gate insulating layer 142 are not removed at the ends of the first active layer 130, the first semiconductor portion 133 and the second semiconductor portion 134 may be formed. Since the first semiconductor portion 133 and the second semiconductor portion 134 are portions of the first active layer 130, and are not exposed during the patterning process of the first gate insulating layer 141 and the second gate insulating layer 142, whereby the first semiconductor portion 133 and the second semiconductor portion 134 may maintain semiconductor characteristics without being conductorized.

According to one embodiment of the present disclosure, the first semiconductor portion 133 may overlap the first electrode 171, and the second semiconductor portion 134 may overlap the second electrode 172.

Since the first electrode 171 and the second electrode 172 are extended along the sides of the first gate insulating layer 141 and the second gate insulating layer 142, respectively, and are connected to the first connection portion 131 and the second connection portion 132, the first semiconductor portion 133 and the second semiconductor portion 134, which are covered by the edges of the patterned first and second gate insulating layers 141 and 142, may overlap the first electrode 171 and the second electrode 172, respectively.

A passivation layer 180 is disposed on the first gate electrode 160, the first electrode 171 and the second electrode 172. The passivation layer 180 is an insulating layer made of an insulating material. The passivation layer 180 may be made of an organic material, may be made of an inorganic material, or may be made of a stacked body of an organic layer and an inorganic layer. The passivation layer 180 protects the thin film transistor 100.

Figure 2:
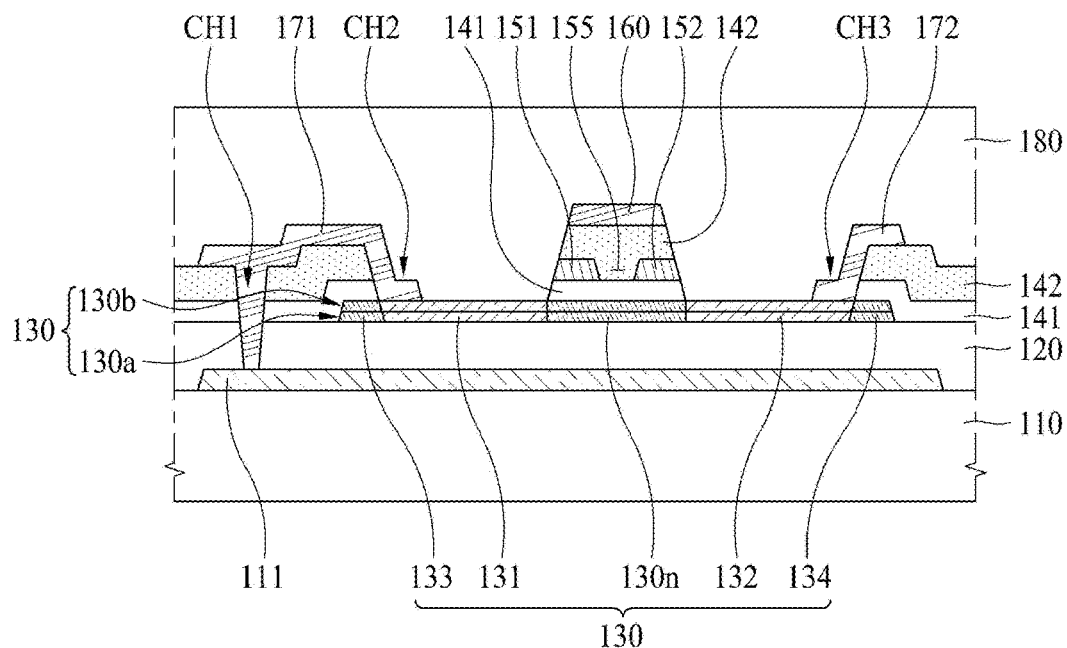
FIG. 2 is a cross-sectional view illustrating a thin film transistor according to another embodiment of the present disclosure.

FIG. 2 is a cross-sectional view illustrating a thin film transistor 200 according to another embodiment of the present disclosure. Hereinafter, the description of the elements, which are already described, will be omitted to avoid redundancy.

In the thin film transistor 200 of FIG. 2, the first active layer 130 has a multi-layered structure in comparison with the thin film transistor 100 of FIG. 1B.

Referring to FIG. 2, the first active layer 130 includes a first oxide semiconductor layer 130a on the base substrate 110 and a second oxide semiconductor layer 130b on the first oxide semiconductor layer 130a. The first oxide semiconductor layer 130a and the second oxide semiconductor layer 130b may include the same semiconductor material, or may include their respective semiconductor materials different from each other.

The first oxide semiconductor layer 130a supports the second oxide semiconductor layer 130b. Therefore, the first oxide semiconductor layer 130a is referred to as a "support layer". The first channel portion 130n may be formed on the second oxide semiconductor layer 130b. Therefore, the second oxide semiconductor layer 130b is referred to as a "channel layer", but one embodiment of the present disclosure is not limited thereto. The first channel portion 130n may be formed in the first oxide semiconductor layer 130a.

A structure in which the active layer 130 includes a first oxide semiconductor layer 130a and a second oxide semiconductor layer 130b is referred to as a bi-layer structure. The multi-layered structure of the first active layer 130 shown in FIG. 2 may be applied to active layers of the other thin film transistors described below.

Figure 3:
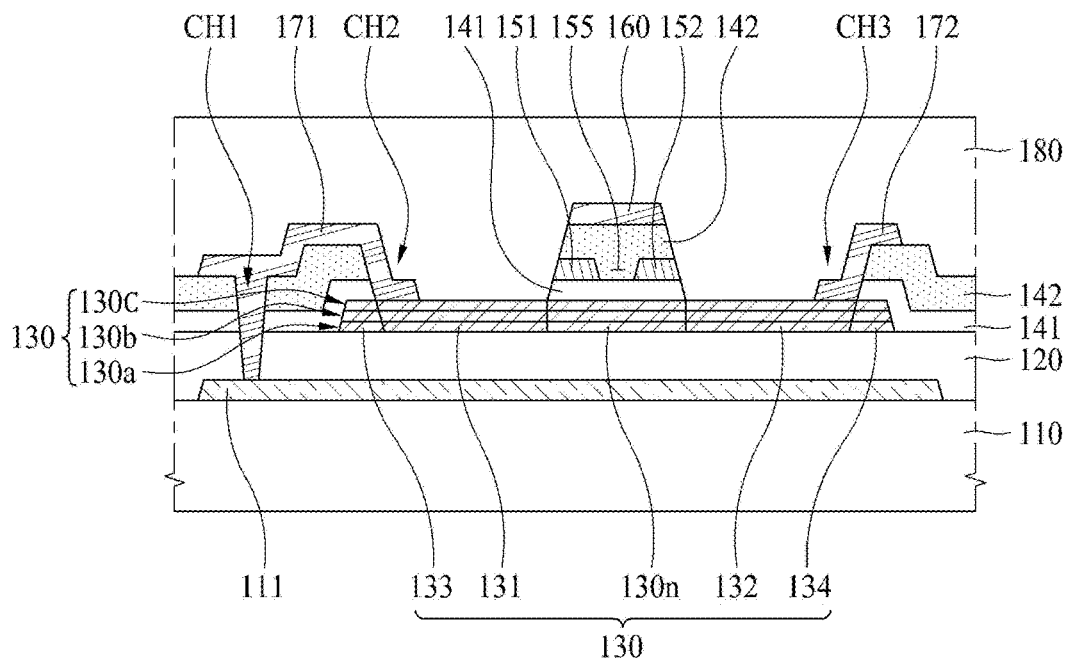
FIG. 3 is a cross-sectional view illustrating a thin film transistor according to another embodiment of the present disclosure.

FIG. 3 is a cross-sectional view illustrating a thin film transistor 300 according to still another embodiment of the present disclosure. The thin film transistor 300 of FIG. 3 further includes a third oxide semiconductor layer 130c on the second oxide semiconductor layer 130b in comparison with the thin film transistor 200 of FIG. 2. With three oxide semiconductor layers, the middle layer is protected from damage during manufacture in both directions, for example the bottom oxide semiconductor layer protects the middle semiconductor layer from gases during manufacture, and the top oxide semiconductor layer protects the middle semiconductor layer from etchant or gases during manufacture.

Referring to FIG. 3, the first active layer 130 includes a first oxide semiconductor layer 130a, a second oxide semiconductor layer 130b and a third oxide semiconductor layer 130c, but still another embodiment of the present disclosure is not limited thereto. The first active layer 130 may further include another semiconductor layer. The multi-layered structure of the first active layer 130 shown in FIG. 3 may be applied to active layers of the other thin film transistors described below.

Figure 4:
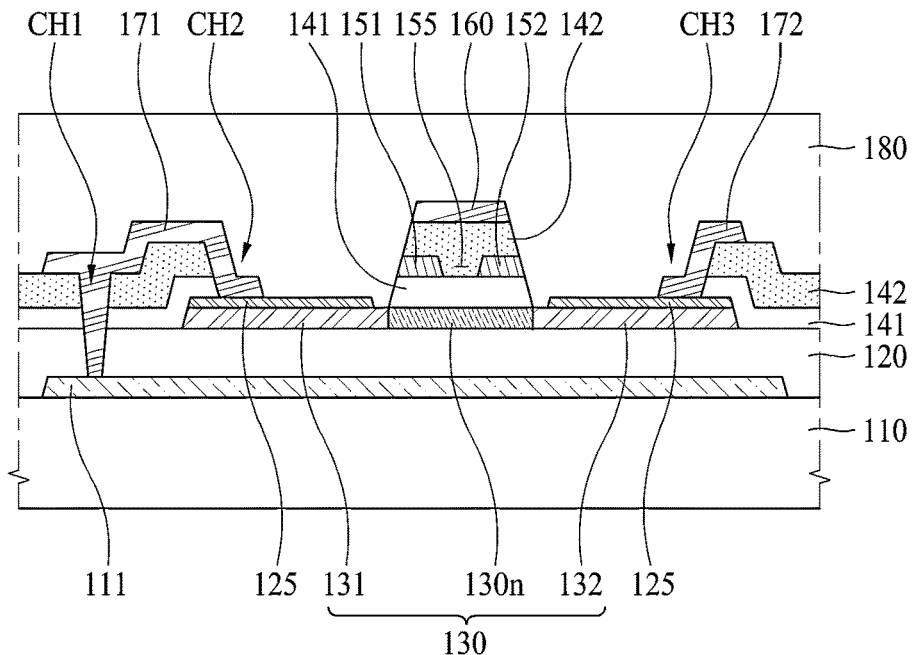
FIG. 4 is a cross-sectional view illustrating a thin film transistor according to another embodiment of the present disclosure.

FIG. 4 is a cross-sectional view illustrating a thin film transistor 400 according to further still another embodiment of the present disclosure.

Referring to FIG. 4, the thin film transistor 400 may further include a conductive material layer 125 disposed on the active layer 130.

According to further still another embodiment of the present disclosure, the conductive material layer 125 may further include a conductive material layer 125 disposed on at least one of the first connection portion 131 or the second connection portion 132. The conductive material layer 125 does not overlap the first channel portion 130n.

According to further still another embodiment of the present disclosure, the conductive material layer 125 may be disposed in contact with the first connection portion 131 and the second connection portion 132. The conductive material layer 125 has reductivity, and the first active layer 130 may be selectively conductorized by the conductive material layer 125. In detail, portions of the first active layer 130, which are in contact with the conductive material layer 125, may be respectively reduced to form the first connection portion 131 and the second connection portion 132. In detail, the conductive material layer 125 takes oxygen from a part of the first active layer 130, which is in contact with the conductive material layer 125. As a result, the first conductive material layer 125 is oxidized, and a part of the active layer 130 contacting the conductive material layer 125 is reduced. Since the part of the first active layer 130 contacting the conductive material layer 125 is reduced, the conductive material layer 125 is referred to having reducing properties (reductivity). In addition, as the oxygen is taken into the conductive material layer 125 from the portions of the first active layer 130 in contact with the conductive material layer 125, oxygen vacancy occurs in the portions of first active layer 130 in contact with the conductive material layer 125, and thus the portion of first active layer 130 in contact with the conductive material layer 125 is conductorized.

For example, when a portion of the first active layer 130, which is in contact with and overlaps the conductive material layer 125, is reduced, oxygen vacancy may be generated in the first active layer 130, and therefore, the first active layer 130 may be selectively conductorized. The first connection portion 131 and the second connection portion 132 may be formed by selective reduction and conductorization of the first active layer 130. According to further still another embodiment of the present disclosure, a part of the active layer 130 contacting the conductive material layer 125 is reduced, which is referred to as a selective reduction. In addition, oxygen vacancy occurs in the portions of first active layer 130 in contact with the conductive material layer 125, and thus the portion of first active layer 130 in contact with the conductive material layer 125 is conductorized, which is referred to as a selective conductorization.

According to one embodiment of the present disclosure, the first active layer 130 may be selectively conductorized by the conductive material layer 125 without a separate conductorization process such as plasma treatment, ion doping or ultraviolet treatment.

The conductive material layer 125 may be made of a metal having reductivity. The conductive material layer 125 may include at least one selected from titanium (Ti), molybdenum (Mo), aluminum (Al), silver (Ag), copper (Cu), chromium (Cr), tantalum (Ta), neodymium (Nd), calcium (Ca), barium (Ba) or a transparent conductive oxide (TCO). The conductive material layer 125 may have reductivity. According to one embodiment of the present disclosure, the transparent conductive oxide TCO may include, for example, ITO(InSnO), IZO(InZnO), IO(InO), TO(SnO) and ZO(ZnO).

Figure 5:
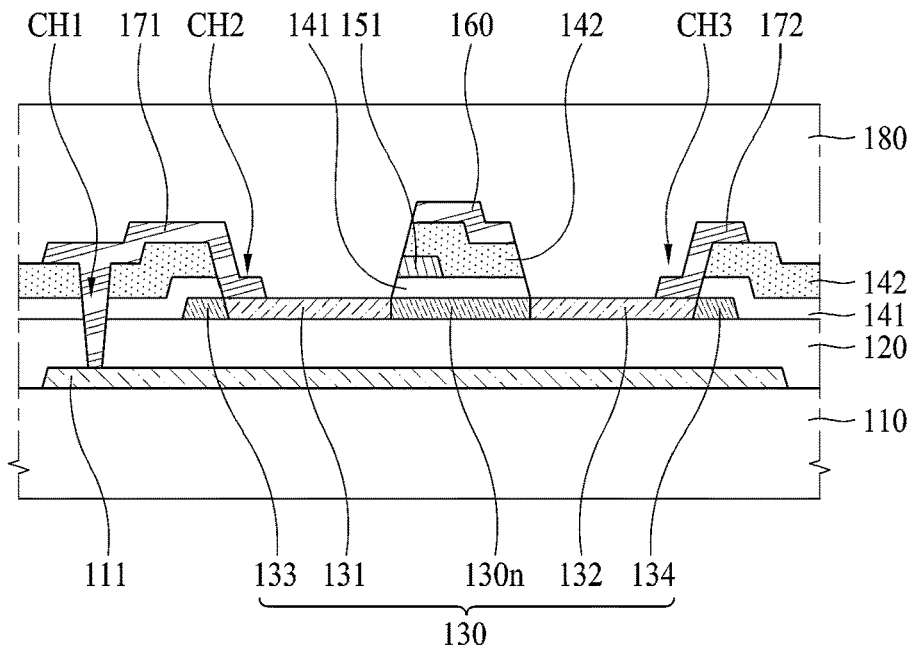
FIG. 5 is a cross-sectional view illustrating a thin film transistor according to another embodiment of the present disclosure.

FIG. 5 is a cross-sectional view illustrating a thin film transistor 500 according to further still another embodiment of the present disclosure.

The thin film transistor 500 of FIG. 5 includes one auxiliary gate electrode in comparison with the thin film transistor 100 of FIG. 1B. In detail, the thin film transistor 500 of FIG. 5 includes a first auxiliary gate electrode 151.

Referring to FIG. 5, the thin film transistor 500 according to further still another embodiment of the present disclosure includes a first active layer 130, a first gate insulating layer 141 on the first active layer 130, a first auxiliary gate electrode 151 on the first gate insulating layer 141, a second gate insulating layer 142 on the first auxiliary gate electrode 151, and a first gate electrode 160 on the second gate insulating layer 142.

The first active layer 130 includes a first channel portion 130n, a first connection portion 131 wherein one side of the first connection portion 131 is in contact with one side of the first channel portion 130n, a first semiconductor portion 133 that is in contact with the other side of the first connection portion 131, a second connection portion 132 that is in contact with the other side of the first channel portion 130n, and a second semiconductor portion 134 that is in contact with the second connection portion 132. The first channel portion 130n overlaps at least one of the first auxiliary gate electrode 151 or the first gate electrode 160.

The first connection portion 131 is disposed between the first channel portion 130n and the first semiconductor portion 133, and the second connection portion 132 is disposed between the first channel portion 130n and the second semiconductor portion 134.

The first connection portion 131 and the second connection portion 132 are exposed from the first gate insulating layer 141 and the second gate insulating layer 142, respectively, and the first semiconductor portion 133 and the second semiconductor portion 134 are covered by the first gate insulating layer 141 and the second gate insulating layer 142, respectively.

Referring to FIG. 5, the first auxiliary gate electrode 151 overlaps the first gate electrode 160. The first channel portion 130n overlaps the first gate electrode 160, and has an area that does not overlap the first auxiliary gate electrode 151.

Referring to FIG. 5, the first auxiliary gate electrode 151 overlaps the first channel portion 130n in the direction of the first connection portion 131. That is to say that the first auxiliary gate electrode 151 may overlap the first channel portion 130n at a side of the first channel portion 130n nearest the first connection portion 131. In more detail, the first auxiliary gate electrode 151 overlaps the edge of the first channel portion 130n in the direction of the first connection portion 131.

The thin film transistor 500 of FIG. 5 includes a first electrode 171 disposed on the same layer as the first gate electrode 160 to contact the first connection portion 131. The first electrode 171 may serve as a source electrode. The thin film transistor 500 of FIG. 5 includes a second electrode 172 that is spaced apart from the first electrode 171 and disposed on the same layer as the first gate electrode 160, and includes a second electrode 172 that is in contact with the second connection portion 132. The second electrode 172 may serve as a drain electrode.

Referring to FIG. 5, the first semiconductor portion 133 overlaps the first electrode 171, and the second semiconductor portion 134 overlaps the second electrode 172.

Figure 6:
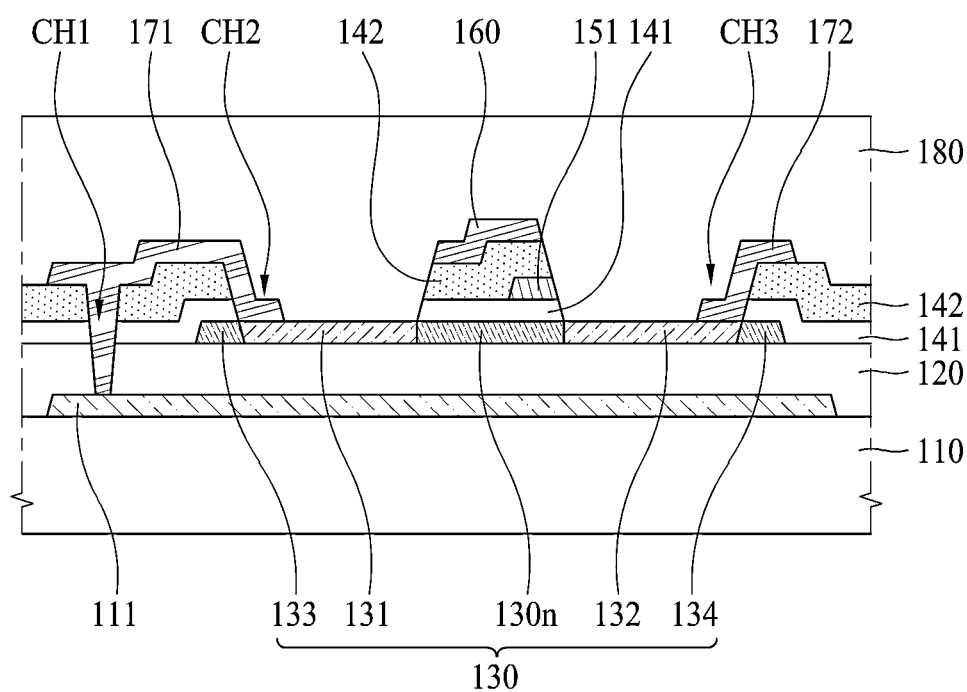
FIG. 6 is a schematic view illustrating a thin film transistor according to another embodiment of the present disclosure.

FIG. 6 is a cross-sectional view illustrating a thin film transistor 600 according to further still another embodiment of the present disclosure.

The thin film transistor 600 of FIG. 6 is different from the thin film transistor 500 of FIG. 5 in a position of the first auxiliary gate electrode 151. Referring to FIG. 6, the first auxiliary gate electrode 151 may overlap the first channel portion 130n in the direction of the second connection portion 132. That is to say that the first auxiliary gate electrode 151 may overlap the first channel portion 130n at a side of the first channel portion 130n nearest the second connection portion 132. In more detail, the first auxiliary gate electrode 151 may overlap the edge of the first channel portion 130n in the direction of the second connection portion 132.

Figure 7:
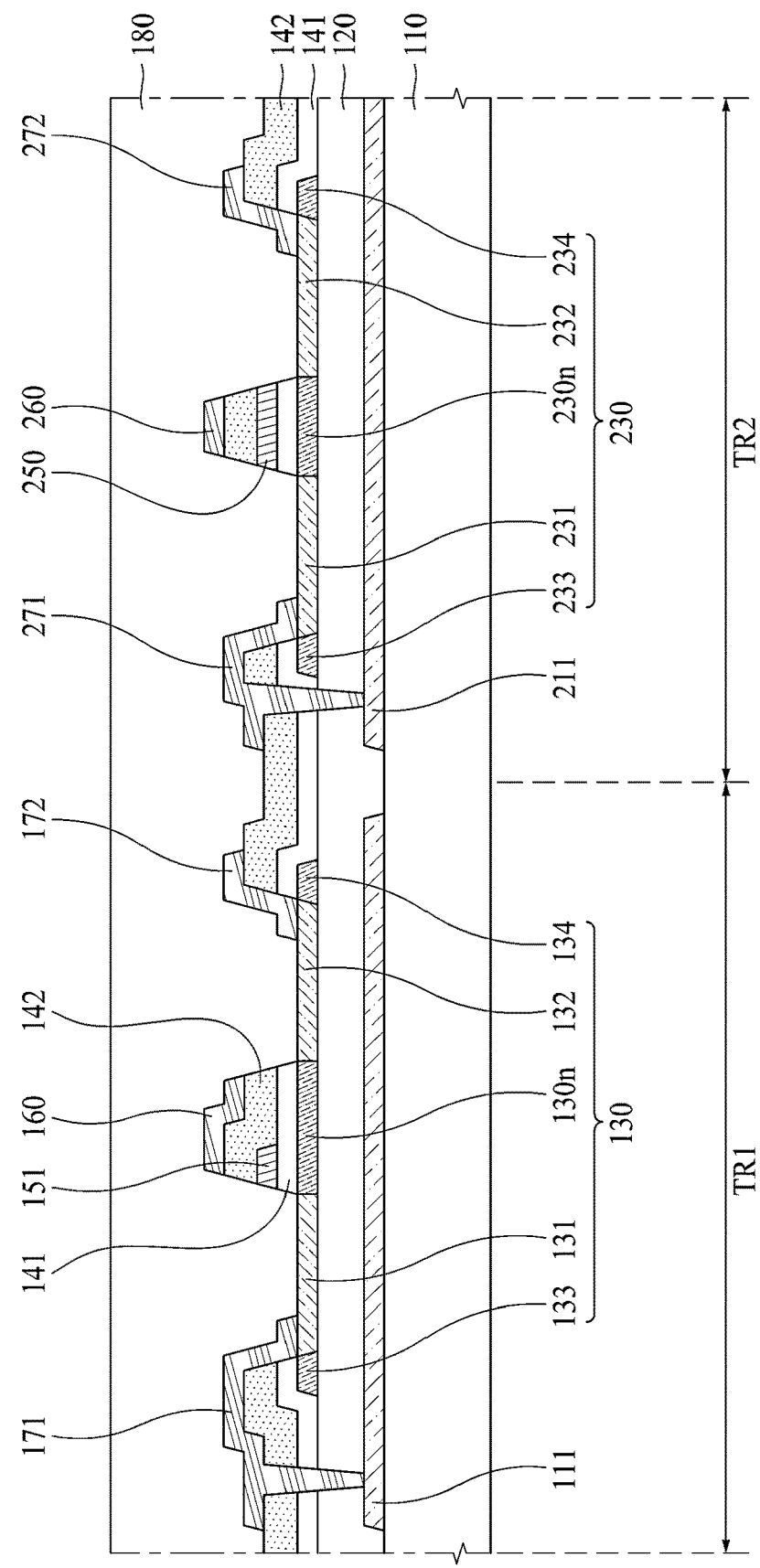
FIG. 7 is a schematic view illustrating a thin film transistor substrate according to another embodiment of the present disclosure.

FIG. 7 is a cross-sectional view illustrating a thin film transistor substrate 700 according to further still another embodiment of the present disclosure.

The thin film transistor substrate 700 according to further still another embodiment of the present disclosure includes a first thin film transistor TR1 and a second thin film transistor TR2 on the base substrate 110.

The first thin film transistor TR1 includes a first active layer 130 having a first channel portion 130n, a first auxiliary gate electrode 151 on the first active layer 130, and a first gate electrode 160 on the first auxiliary gate electrode 151. The second thin film transistor TR2 includes a second active layer 230 having a second channel portion 230n, and a second gate electrode 250 that overlaps the second channel portion 230n.

Referring to FIG. 7, a first light shielding layer 111 and a second light shielding layer 211 may be disposed on the base substrate 110. The first light shielding layer 111 shields light incident from the outside to protect the first thin film transistor TR1, and the second light shielding layer 211 shields light incident from the outside to protect the second thin film transistor TR2.

A buffer layer 120 is disposed on the first light shielding layer 111 and the second light shielding layer 211. The buffer layer 120 may protect the first active layer 130 and the second active layer 230 by shielding the air and moisture.

Referring to FIG. 7, the first thin film transistor TR1 and the second thin film transistor TR2 may be disposed on the buffer layer 120.

Referring to FIG. 7, the first active layer 130 and the second active layer 230 are disposed on the buffer layer 120. The first active layer 130 and the second active layer 230 may be formed by a semiconductor material. At least one of the first active layer 130 or the second active layer 230 may include an oxide semiconductor material.

The first active layer 130 includes a first channel portion 130n, a first connection portion 131 that is in contact with one side of the first channel portion 130n, and a second connection portion 132 that is in contact with the other side of the first channel portion 130n.

The second active layer 230 includes a second channel portion 230n, a third connection portion 231 that is in contact with one side of the second channel portion 230n, and a fourth connection portion 232 that is in contact with the other side of the second channel portion 230n.

A first gate insulating layer 141 is disposed on the first active layer 130 and the second active layer 230. The first gate insulating layer 141 may include at least one of a silicon oxide, a silicon nitride or a metal-based oxide. The first gate insulating layer 141 may have a single layered structure, or may have a multi-layered structure. The first gate insulating layer 141 protects the first channel portion 130n and the second channel portion 230n.

A first auxiliary gate electrode 151 is disposed on the first gate insulating layer 141. Referring to FIG. 7, the first auxiliary gate electrode 151 is disposed between the first active layer 130n and the first gate electrode 160 to overlap a portion of the first channel portion 130n and a portion of the first gate electrode 160.

In FIG. 7, the first auxiliary gate electrode 151 overlaps the first channel portion 130n in the direction of the first connection portion 131. That is to say that the first auxiliary gate electrode 151 may overlap the first channel portion 130n at a side of the first channel portion 130n nearest the first connection portion 131. In more detail, the first auxiliary gate electrode 151 overlaps the edge of the first channel portion 130n in the direction of the first connection portion 131.

Also, according to further still another embodiment of the present disclosure, a second gate electrode 250 is disposed on the first gate insulating layer 141. The second gate electrode 250 is disposed on the same layer as the first auxiliary gate electrode 151 to overlap the second channel portion 230n. According to further still another embodiment of the present disclosure, the second gate electrode 250 may be made of the same material as that of the first auxiliary gate electrode 151 by the same process as that of the first auxiliary gate electrode 151.

A second gate insulating layer 142 is disposed on the first auxiliary gate electrode 151 and the second gate electrode 250. The second gate insulating layer 142 may include at least one of a silicon oxide, a silicon nitride or a metal-based oxide. The second gate insulating layer 142 may have a single layered structure, or may have a multi-layered structure.

According to further still another embodiment of the present disclosure, the first gate insulating layer 141 is disposed between the first active layer 130 and the first auxiliary gate electrode 151 and between the second active layer 230 and the second gate electrode 250. The second gate insulating layer 142 is disposed between the first auxiliary gate electrode 151 and the first gate electrode 160.

Referring to FIG. 7, the first connection portion 131, the second connection portion 132, the third connection portion 231 and the fourth connection portion 232 are exposed from the first gate insulating layer 141 and the second gate insulating layer 142.

The first gate insulating layer 141 and the second gate insulating layer 142 may be patterned to expose the first connection portion 131, the second connection portion 132, the third connection portion 231 and the fourth connection portion 232. According to further still another embodiment of the present disclosure, the first active layer 130 and the second active layer 230 are selectively conductorized during the process of patterning the first gate insulating layer 141 and the second gate insulating layer 142, so that the first connection portion 131, the second connection portion 132, the third connection portion 231 and the fourth connection portion 232, which are conductorization areas, may be formed.

Referring to 7, the first active layer 130 includes a first semiconductor portion 133 spaced apart from the first channel portion 130n to contact the first connection portion 131. The first connection portion 131 is disposed between the first channel portion 130n and the first semiconductor portion 133. The first semiconductor portion 133 is covered by the first gate insulating layer 141.

Also, the first active layer 130 includes a second semiconductor portion 134 spaced apart from the first channel portion 130n to contact the second connection portion 132. The second connection portion 132 is disposed between the first channel portion 130n and the second semiconductor portion 134. The second semiconductor portion 134 is covered by the first gate insulating layer 141.

Referring to 7, the second active layer 230 includes a third semiconductor portion 233 spaced apart from the second channel portion 230n to contact the third connection portion 231. The third connection portion 231 is disposed between the second channel portion 230n and the third semiconductor portion 233. The third semiconductor portion 233 is covered by the first gate insulating layer 141.

Also, the second active layer 230 includes a fourth semiconductor portion 234 spaced apart from the second channel portion 230n to contact the fourth connection portion 232. The fourth connection portion 232 is disposed between the second channel portion 230n and the fourth semiconductor portion 234. The fourth semiconductor portion 234 is covered by the first gate insulating layer 141.

According to further still another embodiment of the present disclosure, the first thin film transistor TR1 may further include a first electrode 171 and a second electrode 172. The second thin film transistor TR2 may further include a third electrode 271, a fourth electrode 272 and a dummy gate electrode 260.

Referring to FIG. 7, the first gate electrode 160, the first electrode 171, the second electrode 172, the third electrode 271, the fourth electrode 272 and the dummy gate electrode 260 are disposed on the second gate insulating layer 142.

The first electrode 171 is disposed on the same layer as the first gate electrode 160 to contact the first connection portion 131. The second electrode 172 is spaced apart from the first electrode 171 and thus disposed on the same layer as the first gate electrode 160, and is in contact with the second connection portion 132. The third electrode 271 is disposed on the same layer as the first gate electrode 160 to contact the third connection portion 231. The fourth electrode 272 is spaced apart from the third electrode 271 and thus disposed on the same layer as the first gate electrode 160, and is in contact with the fourth connection portion 232.

The dummy gate electrode 260 may shield light to protect the second channel portion 230n. The dummy gate electrode 260 may be omitted.

The first electrode 171 may be connected to the first light shielding layer 111 through a contact hole, and the third electrode 271 may be connected to the second light shielding layer 211 through another contact hole.

According to further still another embodiment of the present disclosure, the first semiconductor portion 133 overlaps the first electrode 171, and the second semiconductor portion 134 overlaps the second electrode 172. The third semiconductor portion 233 overlaps the third electrode 271, and the fourth semiconductor portion 234 overlaps the fourth electrode 272.

Referring to FIG. 7, the first electrode 171, the second electrode 172, the third electrode 271 and the fourth electrode 272 are extended along sides of the first gate insulating layer 141 and the second gate insulating layer 142, respectively, which are patterned, to contact the first connection portion 131, the second connection portion 132, the third connection portion 231 and the fourth connection portion 232, respectively. For stable connection, the first gate insulating layer 141 and the second gate insulating layer 142 partially remain without being completely removed from the ends of the first active layer 130 and the ends of the second active layer 230. As a result, even if a process error occurs, the first electrode 171, the second electrode 172, the third electrode 271 and the fourth electrode 272 may be stably in contact with the first connection portion 131, the second connection portion 132, the third connection portion 231 and the fourth connection portion 232, respectively.

According to further still another embodiment of the present disclosure, the same voltage is applied to the first gate electrode 160 and the first auxiliary gate electrode 151. The voltage applied to the first gate electrode 160 and the first auxiliary gate electrode 151 may be referred to as a first gate voltage.

The first channel portion 130n overlaps the first auxiliary gate electrode 151 and the first gate electrode 160, and a current may flow through the first channel portion 130n by an electric field generated when the voltage is applied to the first auxiliary gate electrode 151 and the first gate electrode 160.

In the first thin film transistor TR1, since the first auxiliary gate electrode 151 is disposed to be closer to the first channel portion 130n than the first gate electrode 160, an electric field effect applied to the first channel portion 130n by the first auxiliary gate electrode 151 will be greater than that applied to the first channel portion 130n by the first gate electrode 160. However, referring to FIG. 7, the first auxiliary gate electrode 151 fails to completely cover the first channel portion 130n. Referring to FIG. 7, the first auxiliary gate electrode 151 overlaps the first channel portion 130n in the direction of the first connection portion 131. That is to say that the first auxiliary gate electrode 151 may overlap the first channel portion 130n at a side of the first channel portion 130n nearest the first connection portion 131.

The electric field effect of the first auxiliary gate electrode 151 is not applied to an area of the first channel portion 130n, which does not overlap the first auxiliary gate electrode 151 and only overlaps the first gate electrode 160, but the electric field effect by the first gate electrode 160 is applied thereto, whereby a relatively weak electric field is applied thereto.

As described above, since a weak electric field is applied to a portion of the first channel portion 130n of the first thin film transistor TR1, a current change due to a voltage change may be reduced for a threshold voltage of the thin film transistor 100. As a result, the first thin film transistor TR1 may have a large s-factor. The first thin film transistor TR1 may be used as a driving transistor of a display device.

In addition, according to further still another embodiment of the present disclosure, the same voltage may be applied to the second gate electrode 250 and the dummy gate electrode 260. The voltage applied to the second gate electrode 250 may be referred to as a second gate voltage, but further still another embodiment of the present disclosure is not limited thereto. The dummy gate electrode 260 may not be connected to the gate electrode 260 or the same voltage may not be applied to the second gate electrode 250 and the dummy gate electrode 260, and the dummy gate electrode 260 may be omitted.

The second channel portion 230n overlaps the second gate electrode 250, and a current may flow through the second channel portion 230n by an electric field generated when the voltage is applied to the second gate electrode 250.

According to further still another embodiment of the present disclosure, a distance between the second gate electrode 250 and the second channel portion 230n is shorter than that between the first gate electrode 160 and the first channel portion 130n. The second gate electrode 250 may fully cover the second channel portion 230n. Therefore, when the first thin film transistor TR1 and the second thin film transistor TR2 are turned on, an electric field effect applied to the second channel portion 230n is greater than that applied to the first channel portion 130n.

As a result, the degree of a current change due to a voltage change for a threshold voltage of the second thin film transistor TR2 is greater than that of a current change due to a voltage change for a threshold voltage of the first thin film transistor TR1. The second thin film transistor TR2 has excellent switching characteristics and thus may be used as a switching transistor of a display device.

Figure 8:
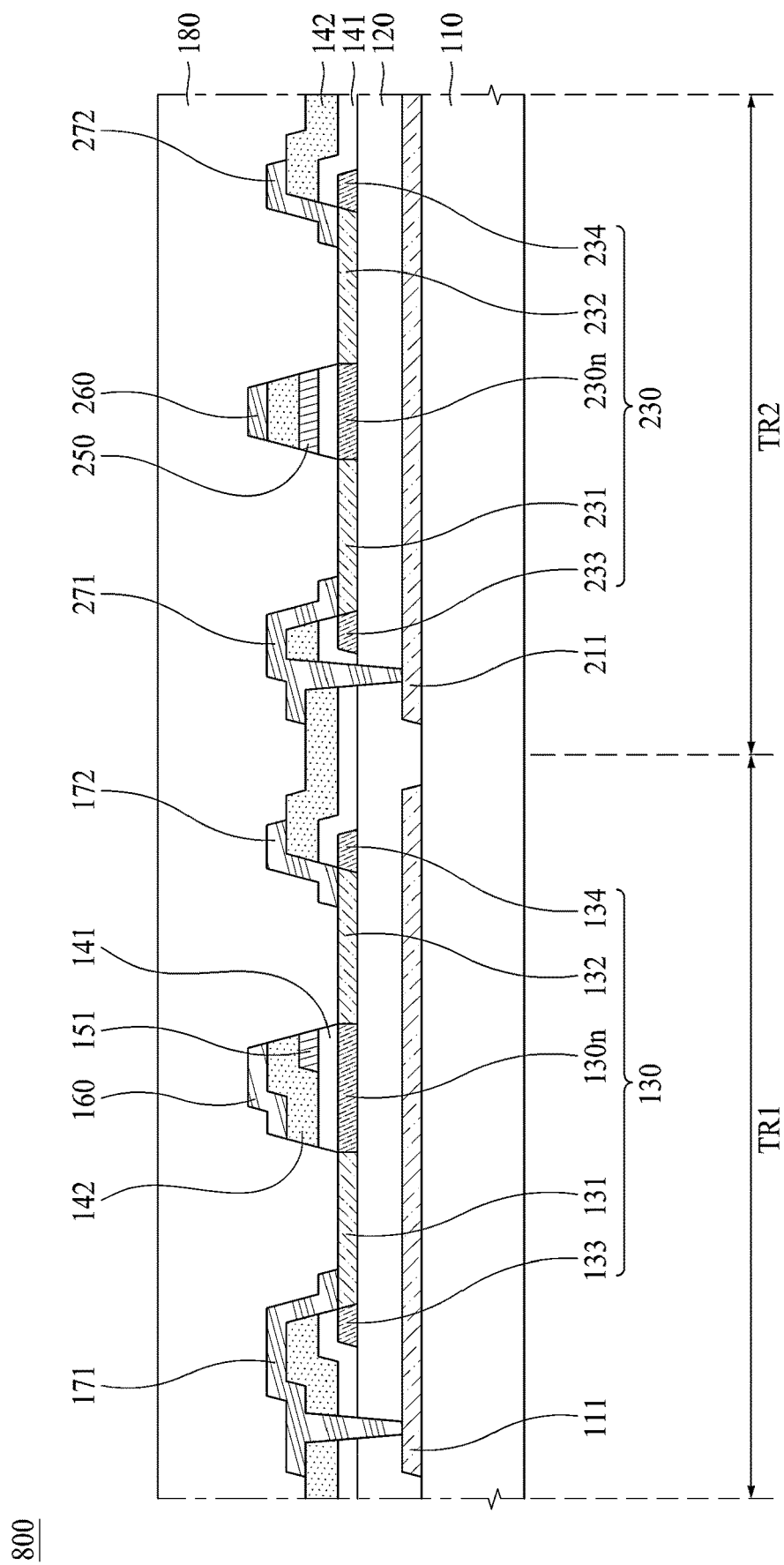
FIG. 8 is a schematic view illustrating a thin film transistor substrate according to another embodiment of the present disclosure.

FIG. 8 is a cross-sectional view illustrating a thin film transistor substrate 800 according to further still another embodiment of the present disclosure.

The thin film transistor substrate 800 of FIG. 8 is different from the thin film transistor substrate 700 of FIG. 7 in a position of the first auxiliary gate electrode 151. Referring to FIG. 8, the first auxiliary gate electrode 151 of the first thin film transistor TR1 may overlap the first channel portion 130n in a direction of the second connection portion 132. That is to say that the first auxiliary gate electrode 151 may overlap the first channel portion 130n at a side of the first channel portion 130n nearest the second connection portion 132. In more detail, the first auxiliary gate electrode 151 may overlap the edge of the first channel portion 130n in the direction of the second connection portion 132.

Figure 9:
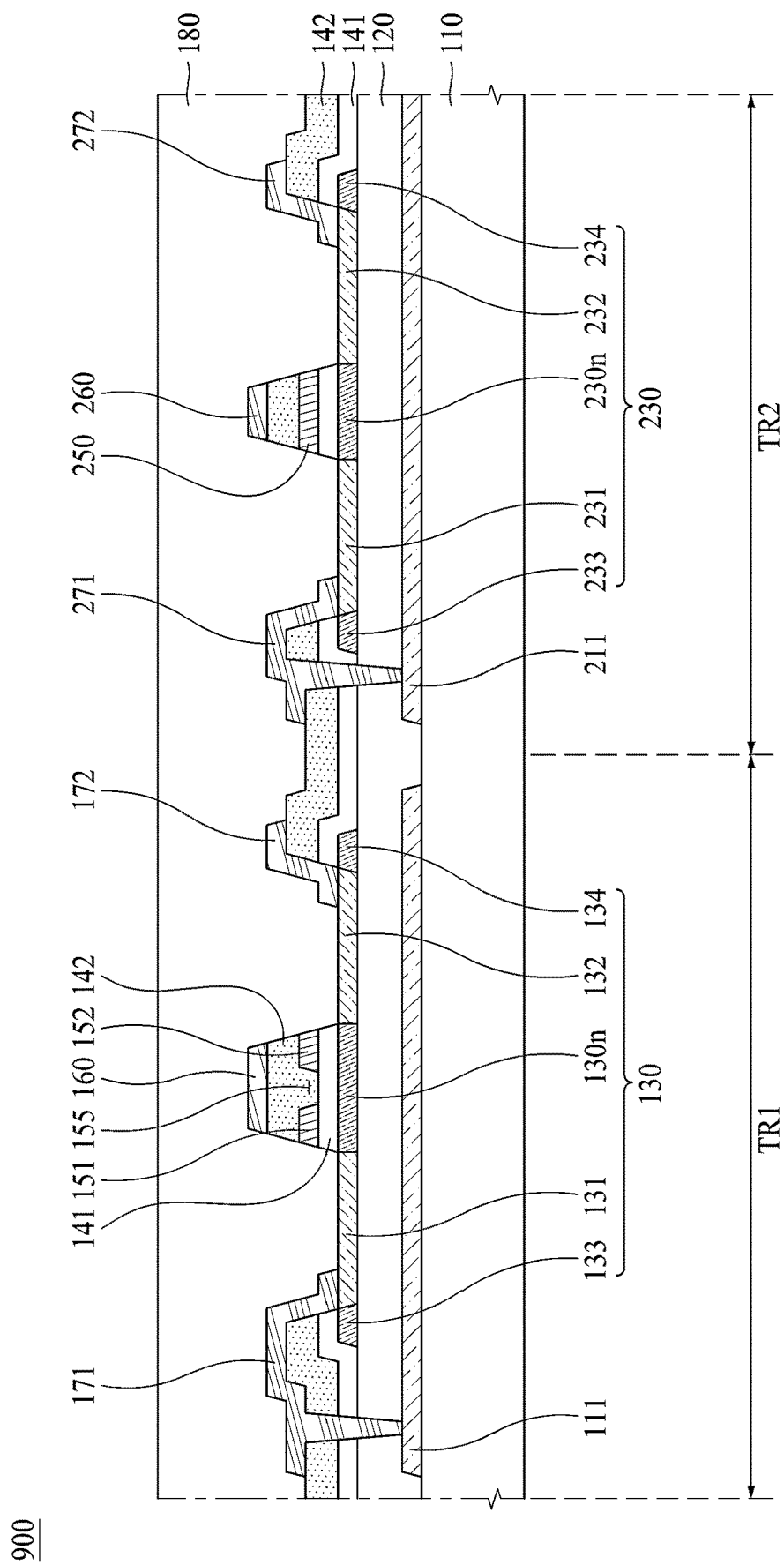
FIG. 9 is a schematic view illustrating a thin film transistor substrate according to another embodiment of the present disclosure.

FIG. 9 is a cross-sectional view illustrating a thin film transistor substrate 900 according to further still another embodiment of the present disclosure.

The thin film transistor substrate 900 of FIG. 9 further includes a second auxiliary gate electrode 152 in comparison with the thin film transistor substrate 700 of FIG. 7.

Referring to FIG. 9, the first thin film transistor TR1 includes a second auxiliary gate electrode 152 spaced apart from the first auxiliary gate electrode 151 and thus disposed on the same layer as the first auxiliary gate electrode 151. The first auxiliary gate electrode 151 and the second auxiliary gate electrode 152 overlap the first channel portion 130n and the first gate electrode 160, respectively. The first auxiliary gate electrode 151 and the second auxiliary gate electrode 152 are spaced apart from each other on the first channel portion 130n. A gap space 155 is formed on the first channel portion 130n as the first auxiliary gate electrode 151 and the second auxiliary gate electrode 152 are spaced apart from each other. The first channel portion 130n overlaps the gap space 155 between the first auxiliary gate electrode 151 and the second auxiliary gate electrode 152.

Figure 10:
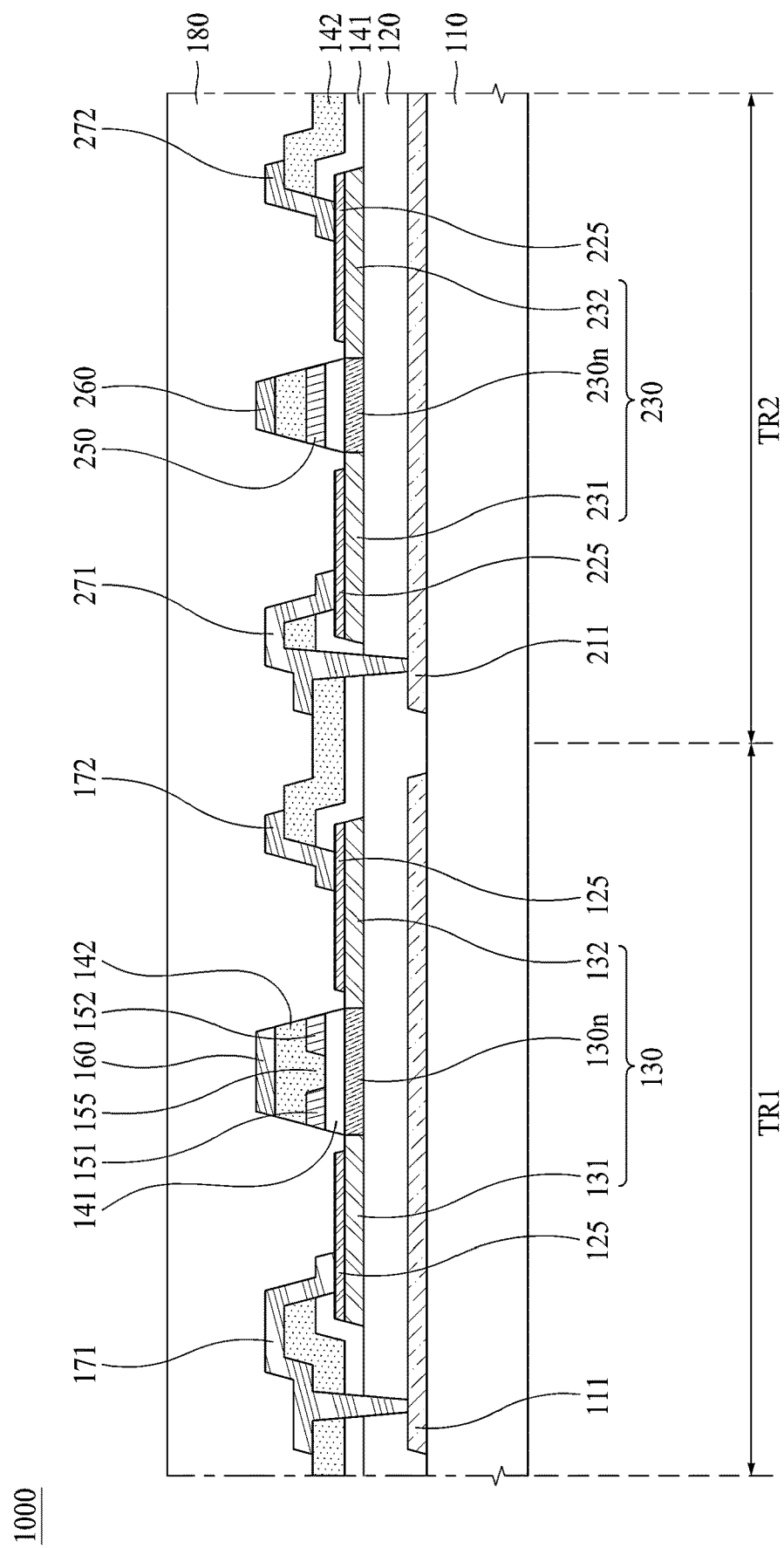
FIG. 10 is a schematic view illustrating a thin film transistor substrate according to another embodiment of the present disclosure.

FIG. 10 is a cross-sectional view illustrating a thin film transistor substrate 1000 according to further still another embodiment of the present disclosure.

Referring to FIG. 10, the thin film transistor substrate 1000 includes conductive material layers 125 and 225 disposed on a first connection portion 131, a second connection portion 132, a third connection portion 231 and a fourth connection portion 232.

In the first thin film transistor TR1, the conductive material layer 125 may be disposed in contact with the first connection portion 131 and the second connection portion 132. The conductive material layer 125 has reductivity, and the first active layer 130 may be selectively conductorized by the conductive material layer 125. In detail, portions of the first active layer 130, which are in contact with the conductive material layer 125, may be respectively reduced to form the first connection portion 131 and the second connection portion 132. The conductive material layer 125 does not overlap the first channel portion 130n.

In the second thin film transistor TR2, the conductive material layer 225 may be disposed in contact with the third connection portion 231 and the fourth connection portion 232. The conductive material layer 225 has reductivity, and the second active layer 230 may be selectively conductorized by the conductive material layer 225. In detail, portions of the second active layer 230, which are in contact with the conductive material layer 225, may be respectively reduced to form the third connection portion 231 and the fourth connection portion 232. The conductive material layer 225 does not overlap the second channel portion 230n.

Figure 11:
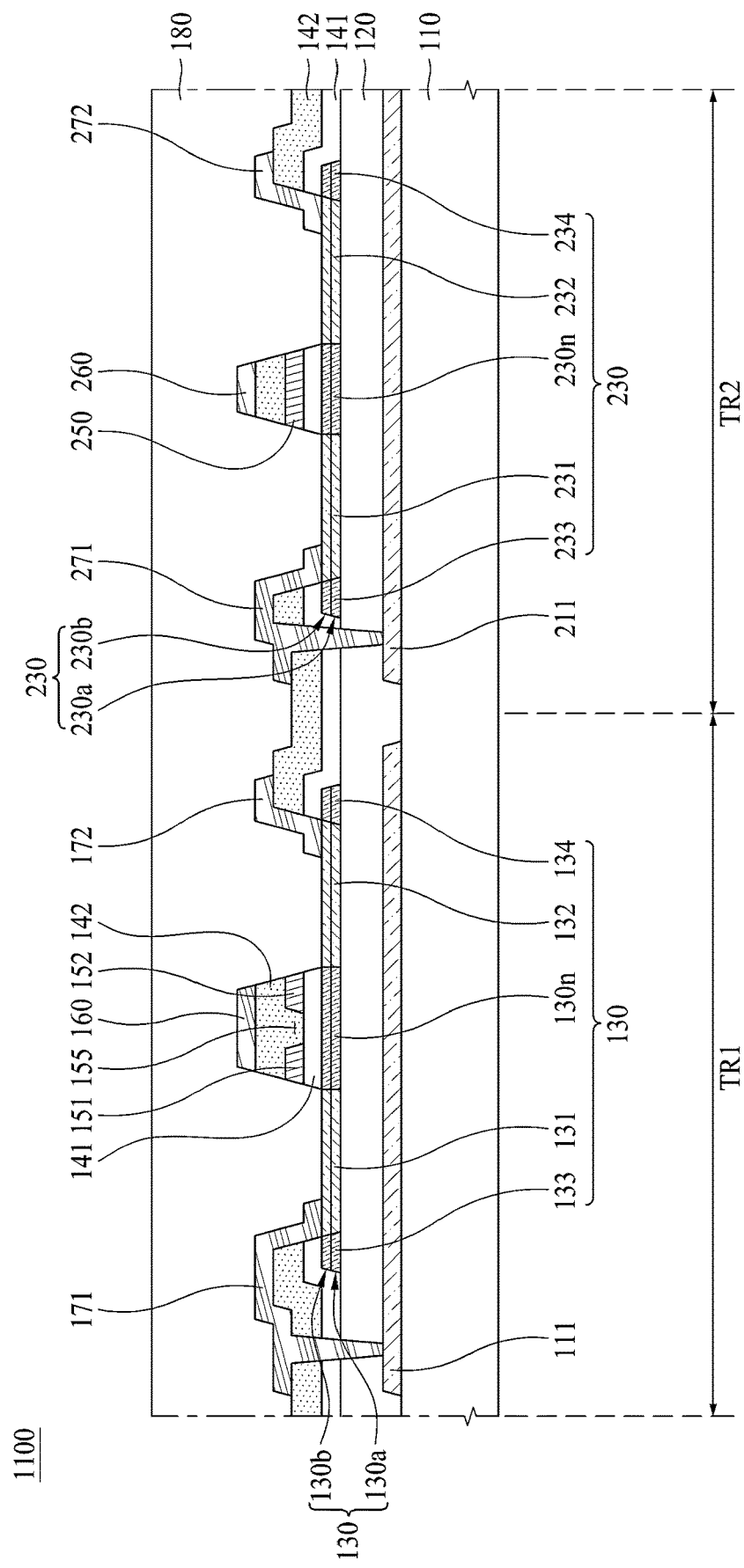
FIG. 11 is a schematic view illustrating a thin film transistor substrate according to another embodiment of the present disclosure.

FIG. 11 is a cross-sectional view illustrating a thin film transistor substrate 1100 according to further still another embodiment of the present disclosure.

According to further still another embodiment of the present disclosure, at least one of the first active layer 130 or the second active layer 230 may include an oxide semiconductor material.

The oxide semiconductor material may include at least one of, for example, an IZO(InZnO)-based, IGO(InGaO)-based, ITO(InSnO)-based, IGZO(InGaZnO)-based, IGZTO (InGaZnSnO)-based, GZTO(GaZnSnO)-based, GZO (GaZnO)-based, ITZO(InSnZnO)-based or FIZO (FeInZnO)-based oxide semiconductor material, but one embodiment of the present disclosure is not limited thereto, and the first active layer 130 and the second active layer 230 may be made of another oxide semiconductor material known in the art.

According to further still another embodiment of the present disclosure, at least one of the first active layer 130 or the second active layer 230 may have a multi-layered structure. For example, at least one of the first active layer 130 or the second active layer 230 may include first oxide semiconductor layers 130a and 230a and second oxide semiconductor layers 130b and 230b on the first oxide semiconductor layers 130a and 230a.

In detail, referring to FIG. 11, the first active layer 130 may include a first oxide semiconductor layer 130a and a second oxide semiconductor layer 130b on the first oxide semiconductor layer 130a. The second active layer 230 may include a first oxide semiconductor layer 230a and a second oxide semiconductor layer 230b on the first oxide semiconductor layer 230a.

The first oxide semiconductor layers 130a and 230a and the second oxide semiconductor layers 130b and 230b may include the same semiconductor material, or may include their respective semiconductor materials being different from each other.

The first oxide semiconductor layers 130a and 230a support the second oxide semiconductor layers 130b and 230b. Therefore, the first oxide semiconductor layers 130a and 230a are referred to as "support layers". The channel portions 130n and 230n may be formed in the second oxide semiconductor layers 130b and 230b. Therefore, the second oxide semiconductor layers 130b and 230b are referred to as "channel layers", but one embodiment of the present disclosure is not limited thereto, and the channel portions 130n and 230n may be formed on the first oxide semiconductor layers 130a and 230a.

A structure in which the active layers 130 and 230 include first oxide semiconductor layers 130a and 230a and second oxide semiconductor layers 130b and 230b is referred to as a bi-layer structure. The bi-layer structure may be applied to the other thin film transistors and the other thin film transistor substrates, which have been already described as above.

Figure 12:
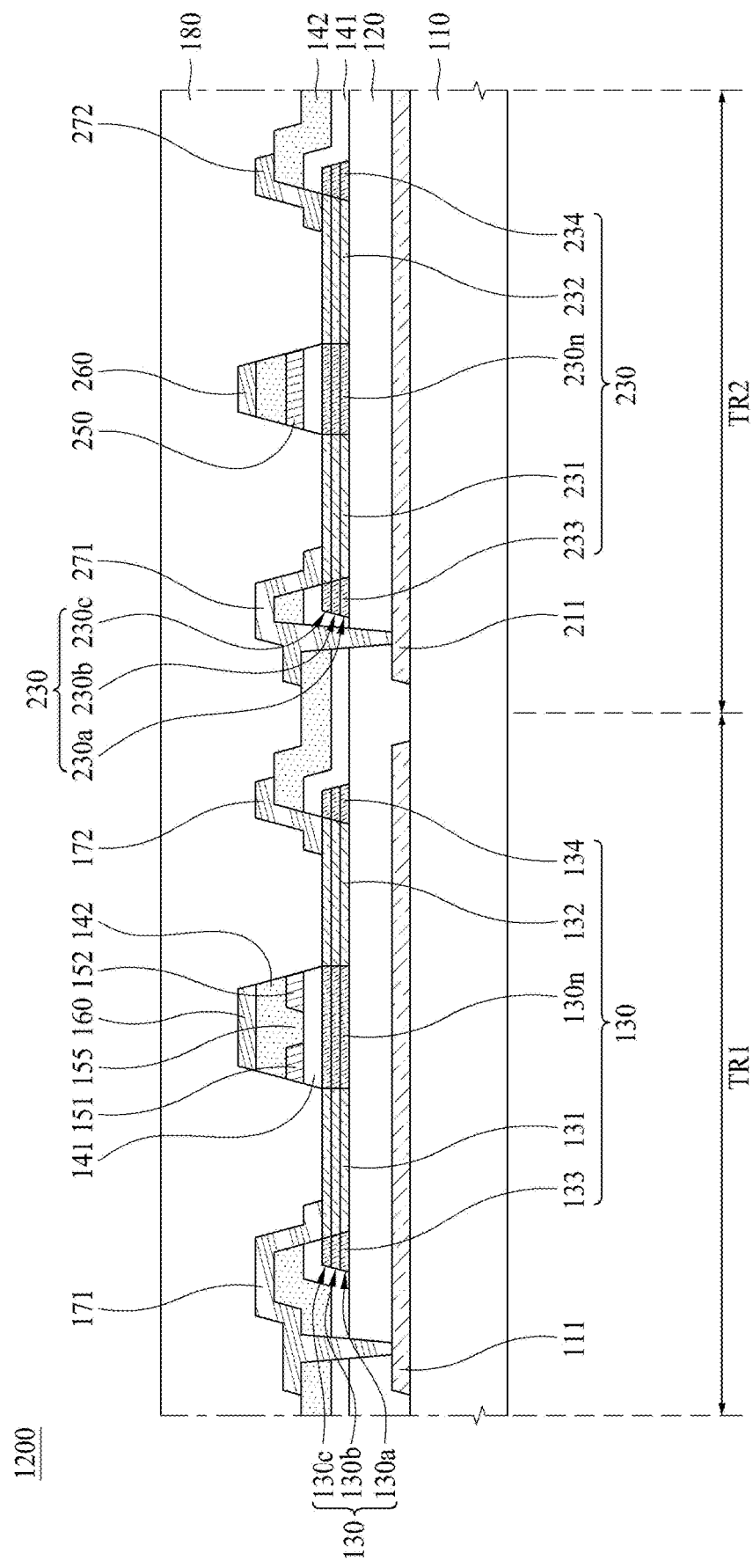
FIG. 12 is a schematic view illustrating a thin film transistor substrate according to another embodiment of the present disclosure.

FIG. 12 is a cross-sectional view illustrating a thin film transistor substrate 1200 according to further still another embodiment of the present disclosure. According to further still another embodiment of the present disclosure, at least one of the first active layer 130 or the second active layer 230 may further include a third oxide semiconductor layer 130c and 230c on the second oxide semiconductor layers 130b and 230b.

In the thin film transistor substrate 1200 of FIG. 12, the active layers 130 and 230 further include third oxide semiconductor layers 130c and 230c on the second oxide semiconductor layers 130b and 230b in comparison with the thin film transistor substrate 1100 of FIG. 11.

Referring to FIG. 12, the active layers 130 and 230 include first oxide semiconductor layers 130a and 230a, second oxide semiconductor layers 130b and 230b and third oxide semiconductor layers 130c and 230c, but still another embodiment of the present disclosure is not limited thereto, and the active layers 130 and 230 may further include other semiconductor layers.

A stacked structure of the active layer shown in FIG. 12 may be also applied to other thin film transistors and other thin film transistor substrates, which have been already described.

Figure 13:
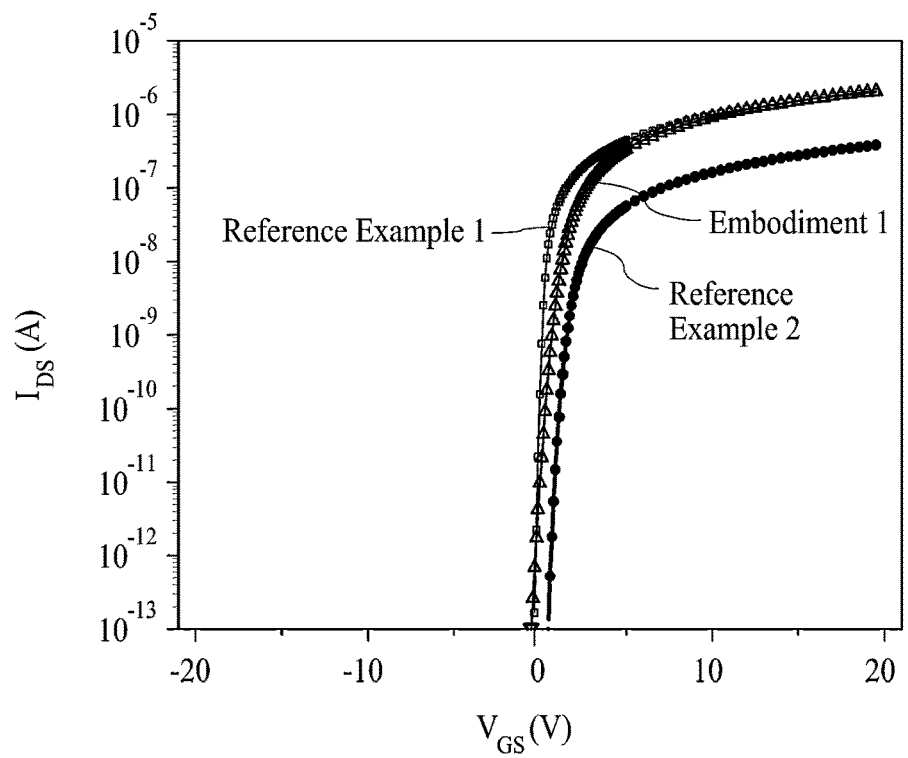
FIG. 13 is a graph illustrating threshold voltages for thin film transistors.

FIG. 13 is a graph illustrating threshold voltages for thin film transistors. The threshold voltage graph for the thin film transistors is represented by a graph of a drain-source current $I_{DS}$ for a gate voltage $V_{GS}$.

FIG. 13 represents the drain-source current $I_{DS}$ relative to the gate voltage $V_{GS}$. For the threshold voltage Vth shown in FIG. 13, an inverse gradient (the reciprocal) of the graph of the drain-source current $I_{DS}$ for the gate voltage $V_{GS}$ is an s-factor. When a slope of the graph is sharp, the s-factor is small, and when the slope of the graph is gentle, the s-factor is large. When the s-factor is large, a rate of change of the drain-source current $I_{DS}$ for the gate voltage is slow.

When the s-factor becomes large, since the rate of change of the drain-source current $I_{DS}$ with respect to the gate voltage becomes slow, it is easy to adjust a magnitude of the drain-source current $I_{DS}$ by adjusting the gate voltage $V_{GS}$.

In the display device driven by the current, for example, in an organic light emitting display device, a gray scale of a pixel may be controlled by adjusting the magnitude of the drain-source current $I_{DS}$ of the driving thin film transistor. The magnitude of the drain-source current $I_{DS}$ of the driving thin film transistor is determined by the gate voltage. Therefore, in the organic light emitting display device driven by the current, it is easy to adjust a gray scale of a pixel as the s-factor of the driving thin film transistor TR becomes large.

In FIG. 13, "Embodiment 1" is a threshold voltage graph for the thin film transistor 100 of FIG. 1. In FIG. 13, "Reference Example 1" is a threshold voltage graph for the second thin film transistor TR2 of FIG. 9. In FIG. 13, "Reference Example 2" is a threshold voltage graph for a thin film transistor in which the second gate electrode 250 is omitted from the second thin film transistor TR2 of FIG. 9 and a second gate voltage is applied to the dummy gate electrode 260.

It is noted that the thin film transistor of the Reference Example 1 has excellent ON-current characteristics but has a large s-factor because of a large rate of change of the drain-source current $I_{DS}$ with respect to the gate voltage. The thin film transistor of the Reference Example 1 may be used as a switching transistor.

In the second thin film transistor TR2 of FIG. 9, a distance between the dummy gate electrode 260 and the second channel portion 230n is large. As a result, it is noted that the thin film transistor of the Reference Example 2 has a relatively large s-factor but has a relatively small ON-current.

On the other hand, it is noted that the thin film transistor 100 of FIG. 1, which is represented by the "Embodiment 1", has a large s-factor and at the same time has excellent ON-current characteristics.

Figure 14:
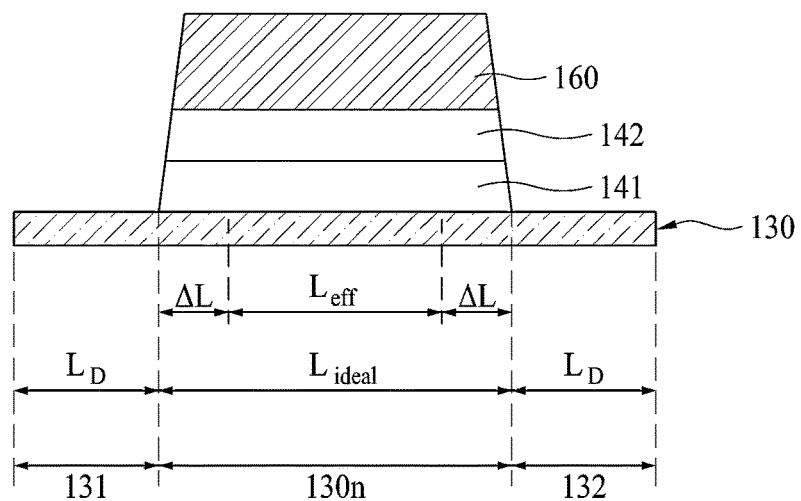
FIG. 14 is a schematic view illustrating a conductorization permeation depth $\Delta L$ of a channel portion.

FIG. 14 is a schematic view illustrating a conductorization permeation depth ΔL of a channel portion.

In the process of forming the first active layer 130 during the fabricating process of the thin film transistors 100, 200, 300, 400, 500 and 600, an area designed as the first channel portion 130n may be partially conductorized so that a portion, which cannot serve as a channel, may be generated. According to one embodiment of the present disclosure, the portion of the area designed as the first channel portion 130n, which is conductorized so as not to serve as a channel, has a length that is referred to as a conductorization permeation depth ΔL.

Referring to FIG. 14, a length of the first channel portion 130n in the first active layer 130, which is overlapped with the first gate electrode 160, is represented by "$L_{ideal}$". "$L_{ideal}$" in FIG. 14 may be referred to as an ideal length of the first channel portion 130n. In FIG. 14, "$L_D$" denotes a length of the first connection portion 131 or the second connection portion 132.

A portion of the area designed as the first channel portion 130n may be unnecessarily conductorized during the selective conductorization process for the first active layer 130, and the conductorized area does not serve as a channel. In FIG. 14, a conductorization permeation depth, which is the length of the conductorized portion of the first channel portion 130n, is represented by "ΔL". Also, the length of the area of the first channel portion 130n, which is not conductorized and may effectively serve as a channel, is referred to as an effective channel length $L_{eff}$. When the conductorization permeation depth ΔL is increased, the effective channel length $L_{eff}$ becomes smaller.

The thin film transistor should have an effective channel length $L_{eff}$ of a predetermined length or more in order to perform necessary functions. However, when the conductorization permeation depth ΔL is increased, the length of the first channel portion 130n or a design length of the first channel portion 130n should be increased to make sure of the effective channel length $L_{eff}$. In addition, when the conductorization permeation depth ΔL is generated, it is difficult to accurately design the effective channel length $L_{eff}$.

According to one embodiment of the present disclosure, the first auxiliary gate electrode 151 is disposed to cover the conductorization permeation depth ΔL of at least one side, or the first auxiliary gate electrode 151 and the second auxiliary gate electrode 152 are disposed to cover the conductorization permeation depth ΔL of both sides of the first channel portion 130n. As a result, difficulty in designing the effective channel length $L_{eff}$ is reduced, and it is possible to design the accurate effective channel length $L_{eff}$.

In more detail, according to one embodiment of the present disclosure, the first auxiliary gate electrode 151 and the second auxiliary gate electrode 152 are disposed to overlap the edge of the first channel portion 130n. Since the same voltage as the that applied to the first gate electrode 160 is applied to the first auxiliary gate electrode 151 and the second auxiliary gate electrode 152, when the thin film transistor is turned on, the area of the first channel portion 130n, which overlaps the first auxiliary gate electrode 151 and the second auxiliary gate electrode 152, may have electrical conductivity such as a conductor. When a length where the first auxiliary gate electrode 151 and the second auxiliary gate electrode 152 overlap the first channel portion 130n is greater than the conductorization permeation depth ΔL that is experimentally obtained, variability of the effective channel length $L_{eff}$ due to the conductorization permeation depth ΔL may be resolved, so that the effective channel length $L_{eff}$ may be clearly defined.

According to one embodiment of the present disclosure, a distance between the first auxiliary gate electrode 151 and the second auxiliary gate electrode 152 may be defined as an effective channel length $L_{eff}$. In this case, since the effective channel length $L_{eff}$ is clearly specified, it is easy to determine and design the length of the first channel portion 130n, and a performance deviation of the thin film transistors may be minimized.

FIGS. 15A to 15F are schematic views illustrating a fabricating process of a thin film transistor substrate 900 according to another embodiment of the present disclosure.

Referring to FIG. 15A, a first light shielding layer 111 and a second light shielding layer 211 are formed on a base substrate 110, and a buffer layer 120 is formed on the first light shielding layer 111 and the second light shielding layer 211. A first active layer 130 and a second active layer 230 are formed on the buffer layer 120.

Figure 15B:
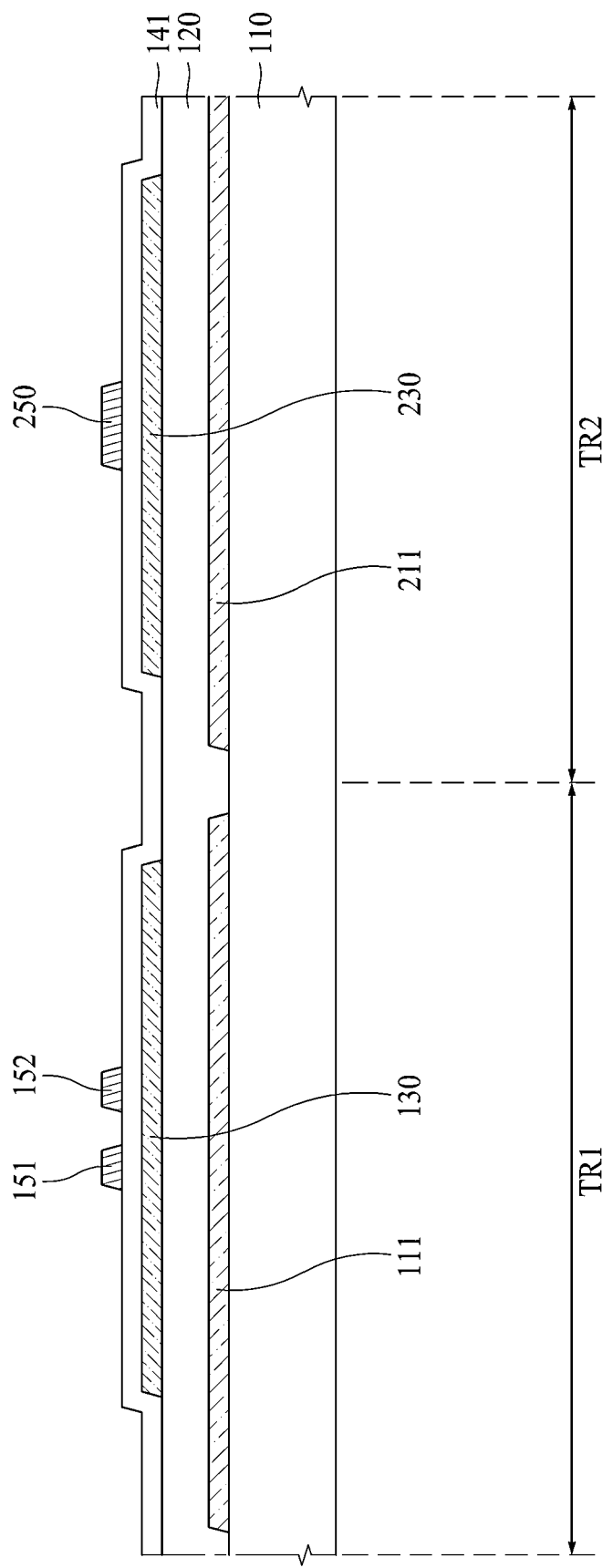

Referring to FIG. 15B, a first gate insulating layer 141 is formed on the first active layer 130 and the second active layer 230, and a first auxiliary gate electrode 151 and a second auxiliary gate electrode 152 are formed on the first gate insulating layer 141. A second gate electrode 250 is formed on the first gate insulating layer 141.

Figure 15C:
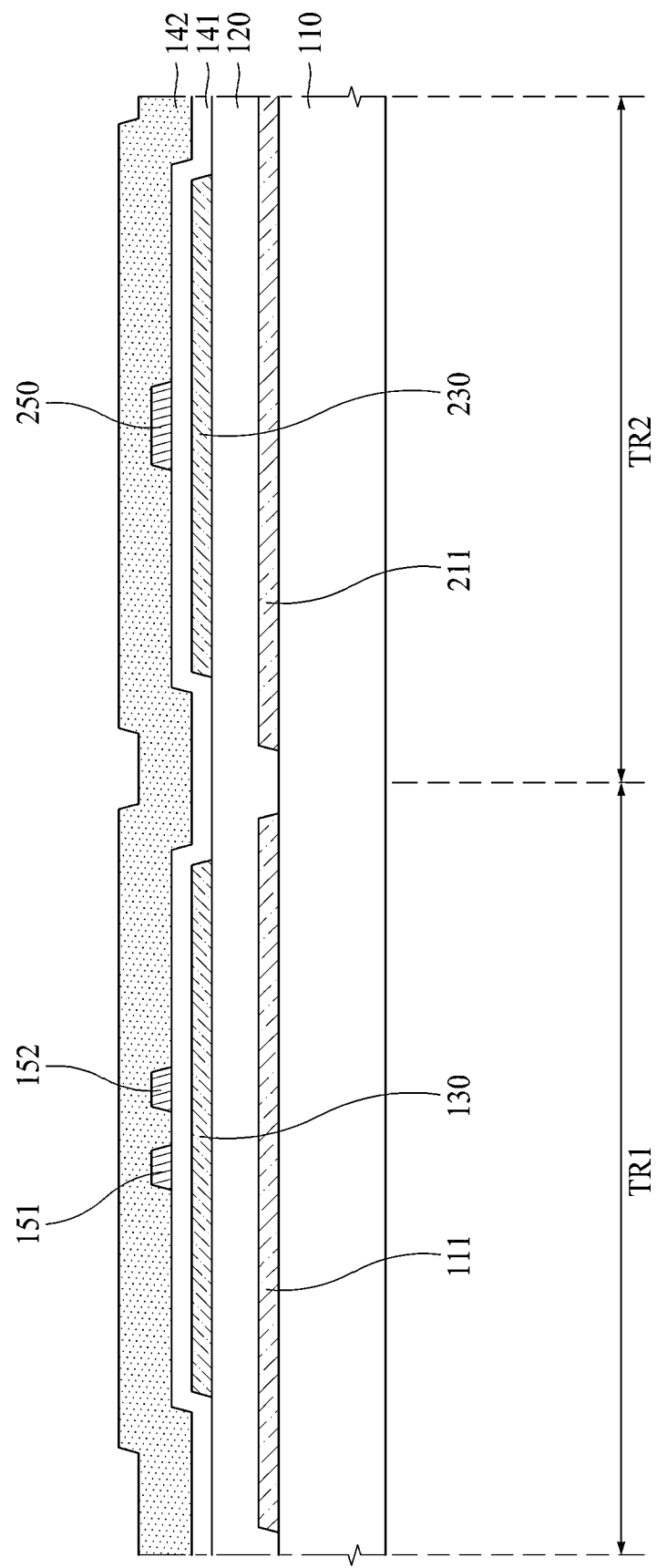

Referring to FIG. 15C, a second gate insulating layer 142 is formed on the first auxiliary gate electrode 151, the second auxiliary gate electrode 152 and the second gate electrode 250.

Figure 15D:
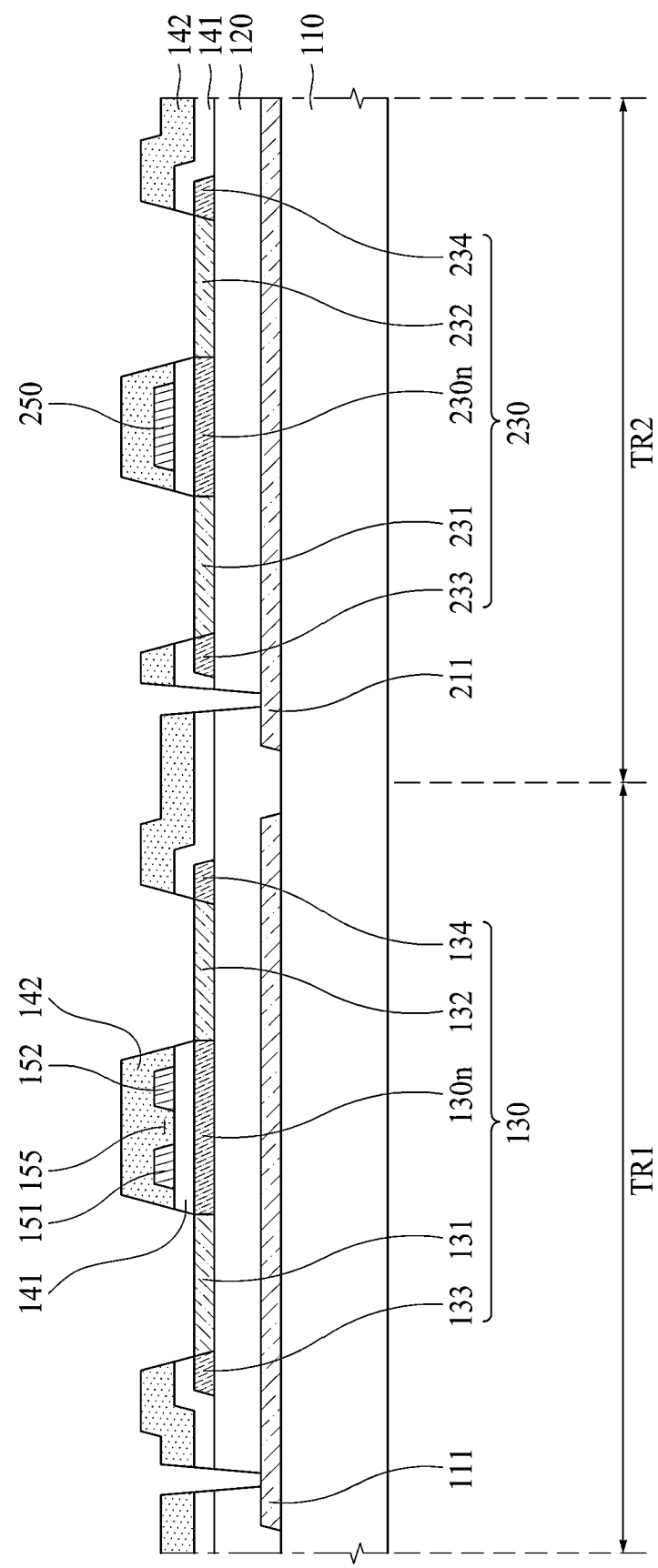

Referring to FIG. 15D, the first gate insulating layer 141 and the second gate insulating layer 142 are patterned. For example, the first gate insulating layer 141 and the second gate insulating layer 142 may be patterned by etching.

Portions of the first active layer 130 and the second active layer 230 are selectively exposed by patterning of the first gate insulating layer 141 and the second gate insulating layer 142. Contact holes are also formed by patterning of the first gate insulating layer 141 and the second gate insulating layer 142.

A first connection portion 131, a second connection portion 132, a third connection portion 231 and a fourth connection portion 232 may be formed by patterning of the first gate insulating layer 141 and the second gate insulating layer 142. However, a width or length of the first gate insulating layer 141 and the second gate insulating layer 142, which remain without being removed in the step of FIG. 15, may be greater than a final design target value.

Referring to FIG. 15E, a first gate electrode 160, a first electrode 171, a second electrode 172, a third electrode 271, a fourth electrode 272 and a dummy gate electrode 260 are formed on the second gate insulating layer 142 that remains after patterning. The first electrode 171, the second electrode 172, the third electrode 271 and the fourth electrode 272 are extended along sides of the first gate insulating layer 141 and the second gate insulating layer 142, which are patterned, and thus are in contact with the first connection portion 131, the second connection portion 132, the third connection portion 231 and the fourth connection portion 232, respectively.

The first gate insulating layer 141 and the second gate insulating layer 142 partially remain at an end of the first active layer 130 and at an end of the second active layer 230 without being completely removed. As a result, even though any process error occurs, the first electrode 171, the second electrode 172, the third electrode 271 and the fourth electrode 272 may be stably in contact with the first connection portion 131, the second connection portion 132, the third connection portion 231 and the fourth connection portion 232, respectively.

Figure 15F:
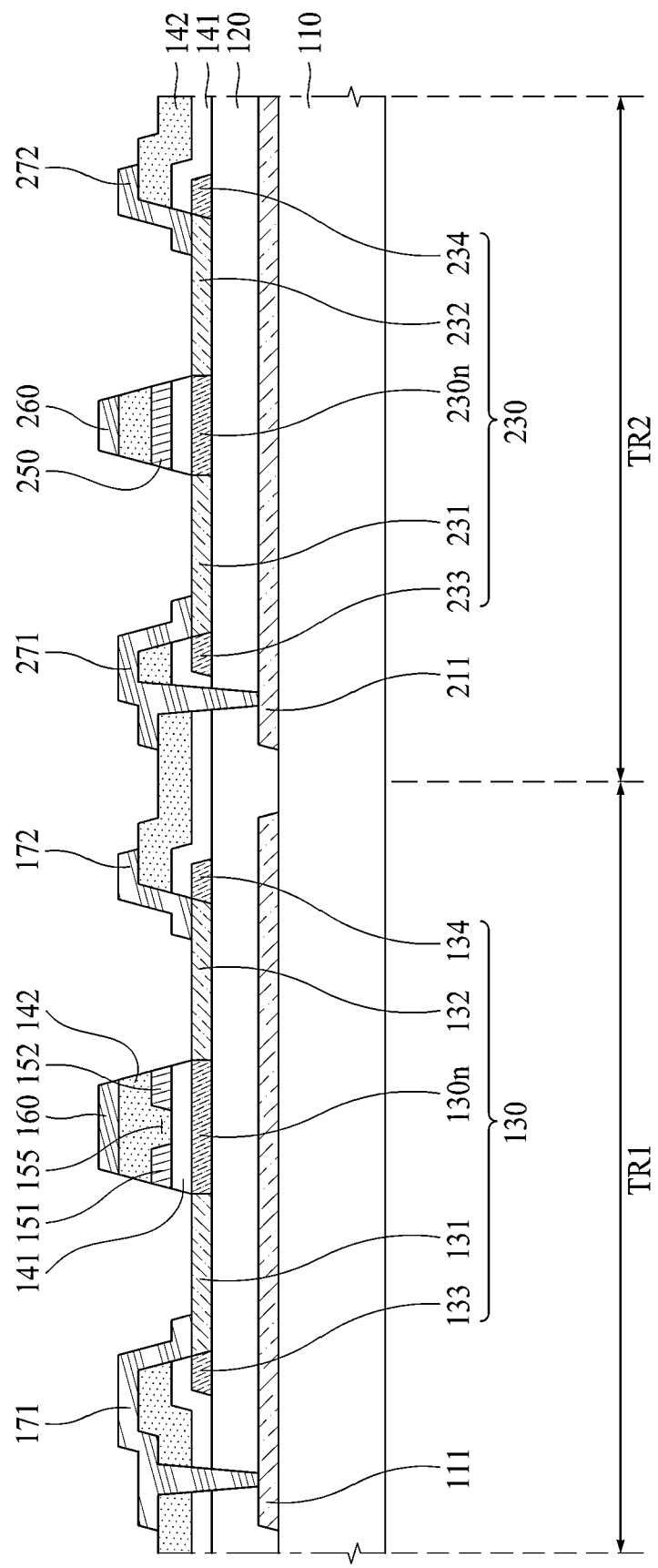

Referring to FIG. 15F, the first gate insulating layer 141 and the second gate insulating layer 142 are additionally etched. As a result, the first channel portion 130n and the second channel portion 230n, each of which has a size of the final design target value, may be formed.

Hereinafter, the display devices according to another embodiment of the present disclosure will be described. The display devices according to another embodiment of the present disclosure may include the above-described thin film transistors 100, 200, 300, 400, 500 and 600 or the above-described thin film transistor substrates 700, 800, 900, 1000, 1100 and 1200. The display device may comprise an LED, OLED, LCD, PDP, microLED, or a miniLED display device.

Figure 16:
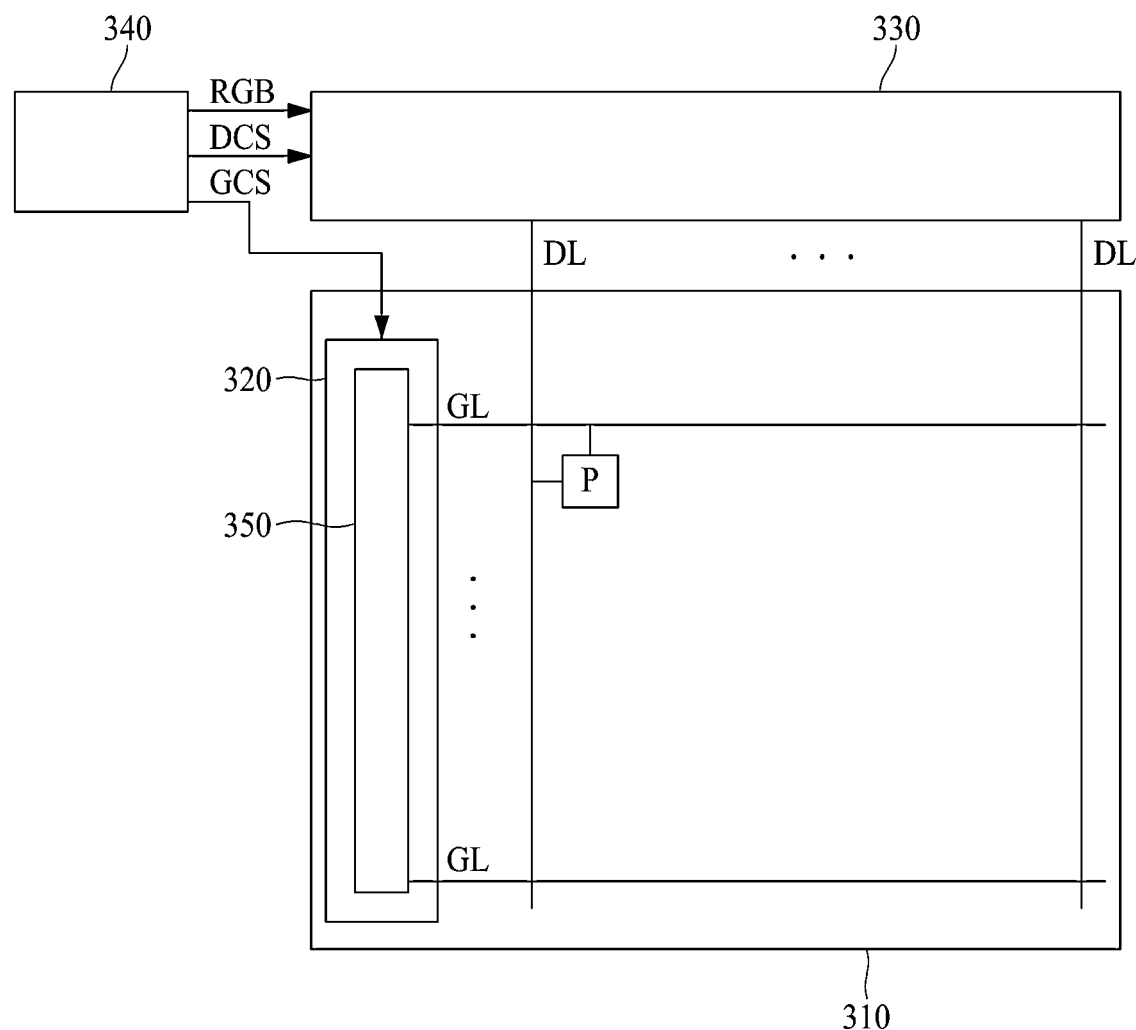
FIG. 16 is a schematic view illustrating a display device according to another embodiment of the present disclosure.

FIG. 16 is a schematic view illustrating a display device 1300 according to another embodiment of the present disclosure.

As shown in FIG. 16, the display device 1300 according to another embodiment of the present disclosure includes a display panel 310, a gate driver 320, a data driver 330 and a controller 340.

Gate lines GL and data lines DL are disposed in the display panel 310 and pixels P are disposed in intersection areas of the gate lines GL and the data lines DL. An image is displayed by driving of the pixels P.

The controller 340 controls the gate driver 320 and the data driver 330.

The controller 340 outputs a gate control signal GCS for controlling the gate driver 320 and a data control signal DCS for controlling the data driver 330 by using a signal supplied from an external system (not shown). Also, the controller 340 samples input image data input from the external system, realigns the sampled data and supplies the realigned digital image data RGB to the data driver 330.

The gate control signal GCS includes a gate start pulse GSP, a gate shift clock GSC, a gate output enable signal GOE, a start signal Vst and a gate clock GCLK. Also, control signals for controlling a shift register may be included in the gate control signal GCS.

The data control signal DCS includes a source start pulse SSP, a source shift clock signal SSC, a source output enable signal SOE and a polarity control signal POL.

The data driver 330 supplies a data voltage to the data lines DL of the display panel 310. In detail, the data driver 330 converts the image data RGB input from the controller 340 into an analog data voltage and supplies the data voltage to the data lines DL.

The gate driver 320 may include a shift register 350.

The shift register 350 sequentially supplies gate pulses to the gate lines GL for one frame by using the start signal and the gate clock, which are transmitted from the controller 340. In this case, one frame means a time period when one image is output through the display panel 310. The gate pulse has a turn-on voltage capable of turning on a switching element (thin film transistor) disposed in the pixel P.

Also, the shift register 350 supplies a gate-off signal capable of turning off a switching element, to the gate line GL for the other period of one frame, at which the gate pulse is not supplied. Hereinafter, the gate pulse and the gate-off signal will be collectively referred to as a scan signal SS or Scan.

According to one embodiment of the present disclosure, the gate driver 320 may be packaged on the substrate 110. In this way, a structure in which the gate driver 320 is directly packaged on the substrate 110 will be referred to as a Gate In Panel (GIP) structure.

Figure 17:
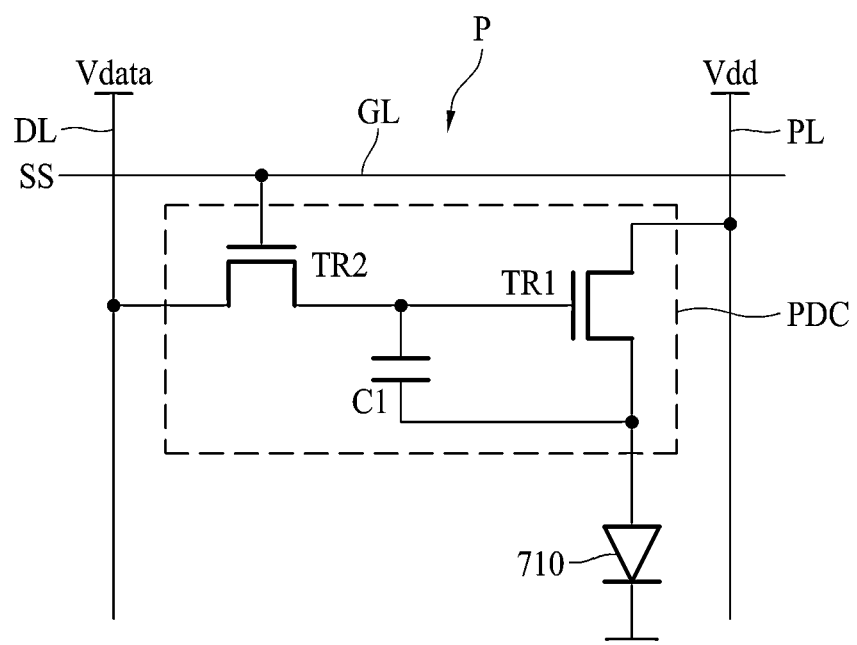
FIG. 17 is a circuit diagram illustrating any one pixel of FIG. 16.
Figure 18:
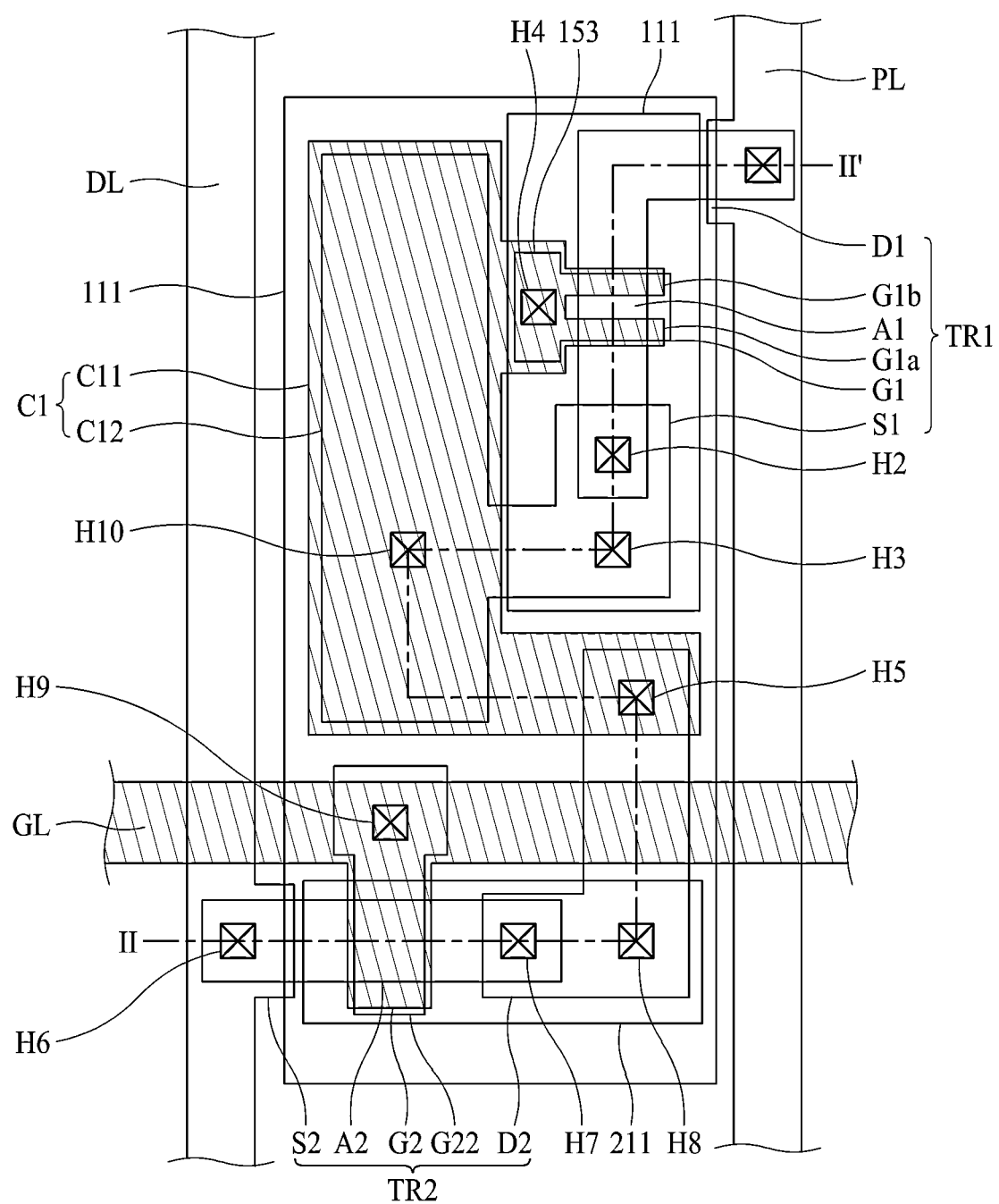
FIG. 18 s a plan view illustrating a pixel of FIG. 17.
Figure 19:
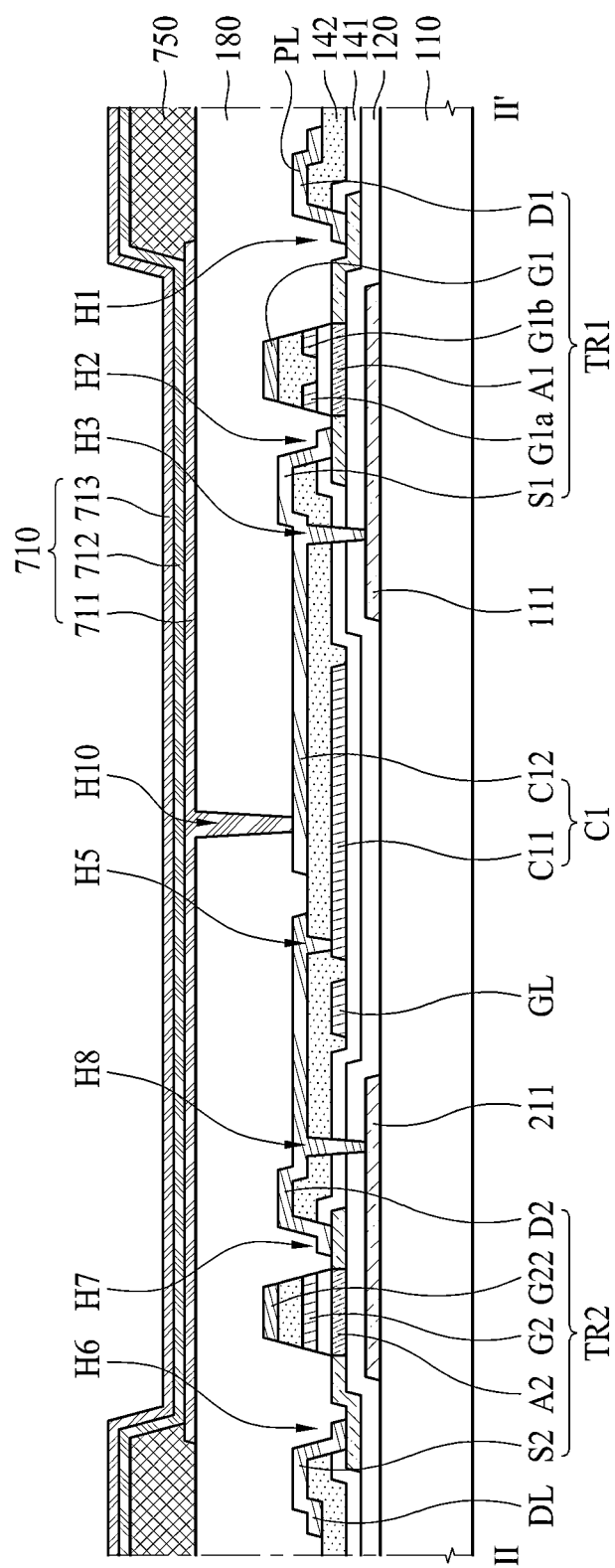
FIG. 19 is a cross-sectional view taken along line II-II' of FIG. 18.

FIG. 17 is a circuit diagram illustrating any one pixel P of FIG. 16, FIG. 18 is a plan view illustrating the pixel P of FIG. 17 and FIG. 19 is a cross-sectional view taken along line II-II' of FIG. 18.

The circuit diagram of FIG. 17 is an equivalent circuit diagram for the pixel P of the display device 1300 that includes an organic light emitting diode (OLED) as a display element 710.

The pixel P includes a display element 710 and a pixel driving circuit PDC for driving the display element 710.

The pixel driving circuit PDC of FIG. 17 includes a first thin film transistor TR1 that is a driving transistor and a second thin film transistor TR2 that is a switching transistor.

The second thin film transistor TR2 is connected to the gate line GL and the data line DL, and is turned on or off by the scan signal SS supplied through the gate line GL.

The data line DL provides a data voltage Vdata to the pixel driving circuit PDC, and the second thin film transistor TR2 controls applying of the data voltage Vdata.

A driving power line PL provides a driving voltage Vdd to the display element 710, and the first thin film transistor TR1 controls the driving voltage Vdd. The driving voltage Vdd is a pixel driving voltage for driving the organic light emitting diode (OLED) that is the display element 710.

When the second thin film transistor TR2 is turned on by the scan signal SS applied from the gate driver 320 through the gate line GL, the data voltage Vdata supplied through the data line DL is supplied to a gate electrode G2 of the first thin film transistor TR1 connected with the display element 710. The data voltage Vdata is charged in a storage capacitor C1 formed between the gate electrode G2 and a source electrode S2 of the first thin film transistor TR1.

The amount of a current supplied to the organic light emitting diode (OLED), which is the display element 710, through the first thin film transistor TR1 is controlled in accordance with the data voltage Vdata, whereby a gray scale of light emitted from the display element 710 may be controlled.

Referring to FIGS. 18 and 19, the first thin film transistor TR1 and the second thin film transistor TR2 are disposed on the base substrate 110.

The base substrate 110 may be made of glass or plastic. Plastic having a flexible property, for example, polyimide (PI) may be used as the base substrate 110.

A first light shielding layer 111 and a second light shielding layer 211 are disposed on the base substrate 110.

The first light shielding layer 111 and the second light shielding layer 211 may light shielding characteristics. The first light shielding layer 111 and the second light shielding layer 211 may shield light incident from the outside to protect active layers A1 and A2.

A buffer layer 120 is disposed on the first and second light shielding layers 111 and 211. The buffer layer 120 is made of an insulating material, and protects the active layers A1 and A2 from external water or oxygen.

The first active layer A1 of the first thin film transistor TR1 and the second active layer A2 of the second thin film transistor TR2 are disposed on the buffer layer 120. For example, the first active layer A1 may include an oxide semiconductor material. The first active layer A1 may be made of an oxide semiconductor layer made of an oxide semiconductor material.

The first active layer A1 of the first thin film transistor TR1 may include a first channel portion, a first connection portion and a second connection portion. The second active layer A2 of the second thin film transistor TR2 may include a second channel portion, a third connection portion and a fourth connection portion.

A first gate insulating layer 141 is disposed on the first active layer A1 and the second active layer A2.

A first auxiliary gate electrode G1a, a second auxiliary gate electrode G1b and a second gate electrode G2 are disposed on the first gate insulating layer 141.

Also, the gate line GL is disposed on the first gate insulating layer 141. The second gate electrode G2 may be extended from the gate line GL, but one embodiment of the present disclosure is not limited thereto, and a portion of the gate line GL may be the gate electrode G2.

Referring to FIGS. 18 and 19, a first capacitor electrode C11 of the storage capacitor C1 is disposed on the first gate insulating layer 141. The first capacitor electrode C11 may be connected to the first auxiliary gate electrode G1a and the second auxiliary gate electrode G1b. The first capacitor electrode C11 may be integrally formed with the first auxiliary gate electrode G1a and the second auxiliary gate electrode G1b. Referring to FIG. 18, a pad electrode 153 is formed between the first auxiliary gate electrode G1a and the second auxiliary gate electrode G1b and the first capacitor electrode C11, so that the first capacitor electrode C11 may be connected to the first auxiliary gate electrode G1a and the second auxiliary gate electrode G1b through the pad electrode 153.

A second gate insulating layer 142 is disposed on the first auxiliary gate electrode G1a, the second auxiliary gate electrode G1b, the second gate electrode G2, the gate line GL, the first capacitor electrode C11 and the pad electrode 153.

The second gate insulating layer 142 is patterned together with the first gate insulating layer 141.

A first gate electrode G1, a first source electrode S1 and a first drain electrode D1 of the first thin film transistor TR1 are disposed on the second gate insulating layer 142. The first source electrode S1 may be referred to as the first electrode 171, and the first drain electrode D1 may be referred to as the second electrode 172.

Also, a second source electrode S2, a second drain electrode D2 and a dummy gate electrode G22 of the second thin film transistor TR2 are disposed on the second gate insulating layer 142. The second source electrode S2 may be referred to as the third electrode 271, and the second drain electrode D2 may be referred to as the fourth electrode 272.

In addition, the data line DL, the driving power line PL, and a second capacitor electrode C12 of the storage capacitor C1 are disposed on the second gate insulating layer 142.

A portion of the data line DL may be extended to become the first drain electrode D1. The first drain electrode D1 is connected to the first active layer A1 through a contact hole H1.

The first source electrode S1 is connected to the first active layer A1 through a contact hole H2, and is connected to the first light shielding layer 111 through a contact hole H3.

The first source electrode S1 and the second capacitor electrode C12 are connected to each other. The first source electrode S1 and the second capacitor electrode C12 may be integrally formed.

The first gate electrode G1 may be connected to the pad electrode 153 through a contact hole H4, and thus may be connected to the first auxiliary gate electrode G1a and the second auxiliary gate electrode G1b.

The second drain electrode D2 of the second thin film transistor TR2 may be connected to the second active layer A2 through a contact hole H7, may be connected to the first capacitor electrode C11 through a contact hole H5, and may be connected to the second light shielding layer 211 through another contact hole H8.

A portion of the data line DL may be extended to become the second source electrode S2. The second source electrode S2 is connected to the second active layer A2 through a contact hole H6.

The dummy gate electrode G22 may be connected to the gate line GL though a contact hole H9 and thus connected to the second gate electrode G2. The dummy gate electrode G22 may be omitted.

A passivation layer 180 is disposed on the first gate electrode G1, the first source electrode S1, the first drain electrode D1, the second source electrode D2, the dummy gate electrode G22, the data line DL, the driving power line PL and the second capacitor electrode C12.

The passivation layer 180 planarizes upper portions of the first thin film transistor TR1 and the second thin film transistor TR2, and protects the first thin film transistor TR1 and the second thin film transistor TR2. The passivation layer 180 may be referred to as a planarization layer.

A first pixel electrode 711 of the display element 710 is disposed on the passivation layer 180. The first pixel electrode 711 is in contact with the second capacitor electrode C12 through a contact hole H10 formed in the passivation layer 180. As a result, the first pixel electrode 711 may be connected to the first source electrode S1 of the first thin film transistor TR1.

A bank layer 750 is disposed at an edge of the first pixel electrode 711. The bank layer 750 defines a light emission area of the display element 710.

An organic light emitting layer 712 is disposed on the first pixel electrode 711, and a second pixel electrode 713 is disposed on the organic light emitting layer 712. Therefore, the display element 710 is completed. The display element 710 shown in FIGS. 18 and 19 is an organic light emitting diode OLED. Therefore, the display device 1300 according to another embodiment of the present disclosure is an organic light emitting display device.

Figure 20:
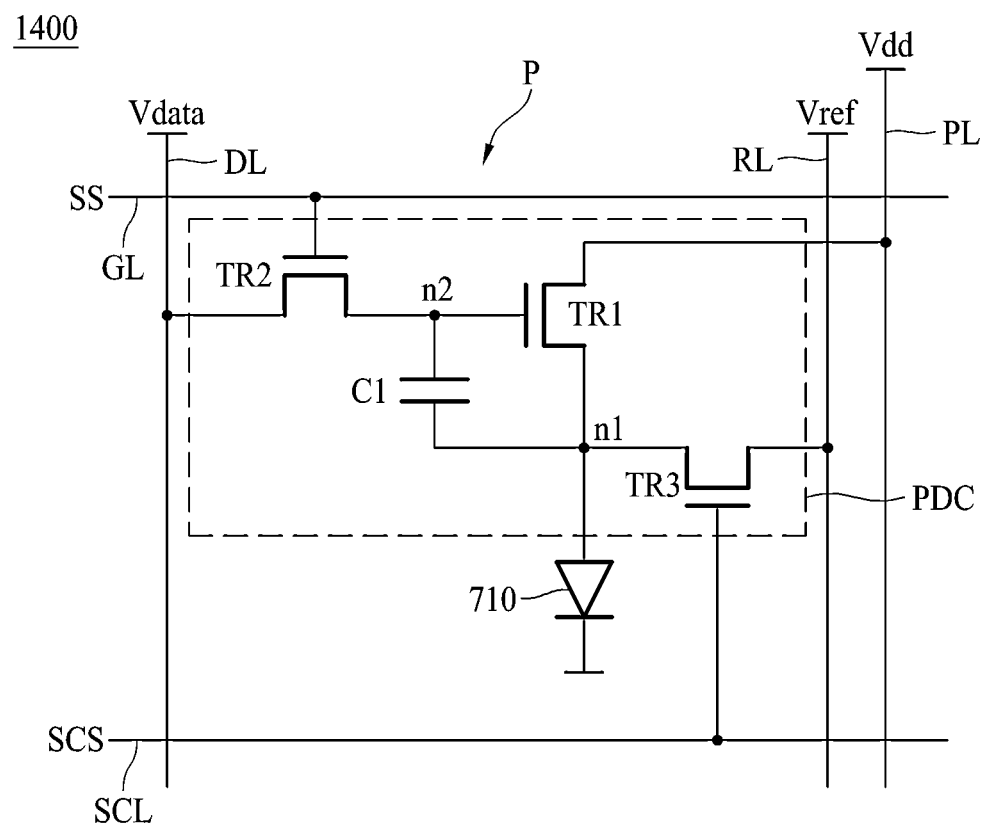
FIG. 20 is a circuit diagram illustrating any one pixel of a display device according to another embodiment of the present disclosure.

FIG. 20 is a circuit diagram illustrating any one pixel P of a display device 1400 according to still another embodiment of the present disclosure.

FIG. 20 is an equivalent circuit diagram illustrating a pixel P of an organic light emitting display device.

The pixel P of the display device 1400 shown in FIG. 20 includes an organic light emitting diode (OLED) that is a display element 710 and a pixel driving circuit PDC for driving the display element 710. The display element 710 is connected with the pixel driving circuit PDC.

In the pixel P, signal lines DL, GL, PL, RL and SCL for supplying a signal to the pixel driving circuit PDC are disposed.

The data voltage Vdata is supplied to the data line DL, the scan signal SS is supplied to the gate line GL, the driving voltage Vdd for driving the pixel is supplied to the driving power line PL, a reference voltage Vref is supplied to a reference line RL and a sensing control signal SCS is supplied to a sensing control line SCL.

The pixel driving circuit PDC includes, for example, a second thin film transistor TR2 (switching transistor) connected with the gate line GL and the data line DL, a first thin film transistor TR1 (driving transistor) for controlling a magnitude of a current output to the display element 710 in accordance with the data voltage Vdata transmitted through the second thin film transistor TR2, and a third thin film transistor TR3 (reference transistor) for sensing characteristics of the first thin film transistor TR1.

The storage capacitor C1 is positioned between the gate electrode of the first thin film transistor TR1 and the display element 710.

The second thin film transistor TR2 is turned on by the scan signal SS supplied to the gate line GL to transmit the data voltage Vdata, which is supplied to the data line DL, to the gate electrode of the first thin film transistor TR1.

The third thin film transistor TR3 is connected to a first node n1 between the first thin film transistor TR1 and the display element 710 and the reference line RL, and thus is turned on or off by the sensing control signal SCS and senses characteristics of the first thin film transistor TR1, which is a driving transistor, for a sensing period.

A second node n2 connected with the gate electrode of the first thin film transistor TR1 is connected with the second thin film transistor TR2. The storage capacitor C1 is formed between the second node n2 and the first node n1.

When the second thin film transistor TR2 is turned on, the data voltage Vdata supplied through the data line DL is supplied to the gate electrode of the first thin film transistor TR1. The data voltage Vdata is charged in the storage capacitor C1 formed between the gate electrode and the source electrode of the first thin film transistor TR1.

When the first thin film transistor TR1 is turned on, the current is supplied to the display element 710 through the first thin film transistor TR1 in accordance with the driving voltage Vdd for driving the pixel, whereby light is output from the display element 710.

Figure 21:
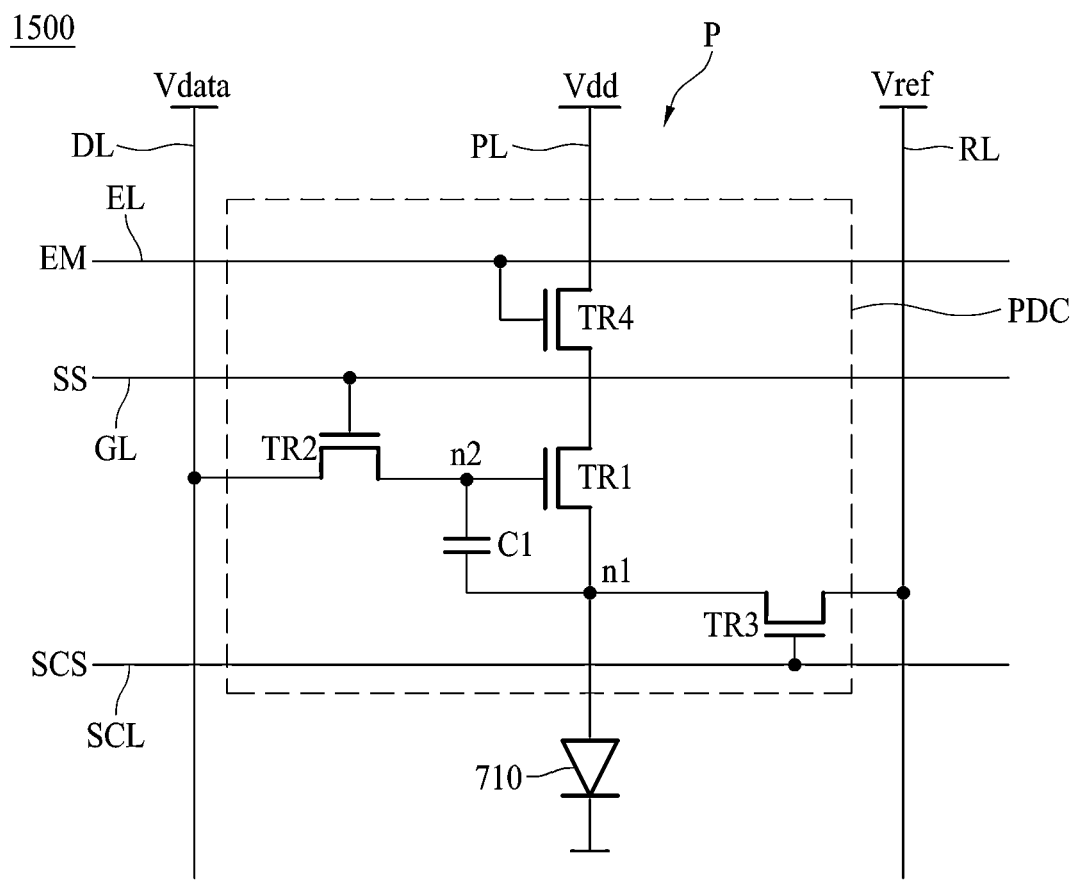
FIG. 21 is a circuit diagram illustrating any one pixel of a display device according to another embodiment of the present disclosure.

FIG. 21 is a circuit diagram illustrating a pixel of a display device 1500 according to further still another embodiment of the present disclosure.

The pixel P of the display device 1500 shown in FIG. 21 includes an organic light emitting diode (OLED) that is a display element 710 and a pixel driving circuit PDC for driving the display element 710. The display element 710 is connected with the pixel driving circuit PDC.

The pixel driving circuit PDC includes thin film transistors TR1, TR2, TR3 and TR4.

In the pixel P, signal lines DL, EL, GL, PL, SCL and RL for supplying a driving signal to the pixel driving circuit PDC are disposed.

In comparison with the pixel P of FIG. 20, the pixel P of FIG. 21 further includes an emission control line EL. An emission control signal EM is supplied to the emission control line EL.

Also, the pixel driving circuit PDC of FIG. 21 further includes a fourth thin film transistor TR4 that is an emission control transistor for controlling a light emission timing of the first thin film transistor TR1, in comparison with the pixel driving circuit PDC of FIG. 20.

A storage capacitor C1 is positioned between the gate electrode of the first thin film transistor TR1 and the display element 710.

The second thin film transistor TR2 is turned on by the scan signal SS supplied to the gate line GL to transmit the data voltage Vdata, which is supplied to the data line DL, to the gate electrode of the first thin film transistor TR1.

The third thin film transistor TR3 is connected to the reference line RL, and thus is turned on or off by the sensing control signal SCS and senses characteristics of the first thin film transistor TR1, which is a driving transistor, for a sensing period.

The fourth thin film transistor TR4 transfers the driving voltage Vdd to the first thin film transistor TR1 in accordance with the emission control signal EM or shields the driving voltage Vdd. When the fourth thin film transistor TR4 is turned on, a current is supplied to the first thin film transistor TR1, whereby light is output from the display element 710.

The pixel driving circuit PDC according to further still another embodiment of the present disclosure may be formed in various structures in addition to the above-described structure. The pixel driving circuit PDC may include, for example, five or more thin film transistors.

According to the present disclosure, the following advantageous effects may be obtained.

In the thin film transistor according to one embodiment of the present disclosure, the auxiliary gate electrode is disposed only in a portion of the area that overlaps the channel portion, and as a result, the s-factor may be increased due to the difference between the electric field effect applied to the portion where the auxiliary gate electrode is disposed and the electric field effect applied to the portion where the auxiliary gate electrode is not disposed. In addition, the auxiliary gate electrode serves to pump the current in the ON-state of the thin film transistor, so that the thin film transistor may have excellent ON-current characteristics.

Since the thin film transistor according to one embodiment of the present disclosure has a large s-factor and at the same time has excellent ON-current characteristics, when the thin film transistor is used as the driving transistor of the display device, a gray scale expression capability of the display device may be improved, and current characteristics may be also improved.

It will be apparent to those skilled in the art that the present disclosure described above is not limited by the above-described embodiments and the accompanying drawings and that various substitutions, modifications and variations can be made in the present disclosure without departing from the or scope of the disclosures. Consequently, the scope of the present disclosure is defined by the accompanying claims and it is intended that all variations or modifications derived from the meaning, scope and equivalent concept of the claims fall within the scope of the present disclosure.

Also disclosed herein:

1. A thin film transistor comprising:
a first active layer;
a first gate electrode at least partially overlapped with the first active layer; and
a first auxiliary gate electrode and a second auxiliary gate electrode between the first active layer and the first gate electrode,
wherein the first active layer includes:
a first channel portion;
a first connection portion that is in contact with a side of the first channel portion; and a second connection portion that is in contact with the other side of the first channel portion,
wherein the first channel portion overlaps the first auxiliary gate electrode, the second auxiliary gate electrode and the first gate electrode,
the first auxiliary gate electrode and the second auxiliary gate electrode are spaced apart from each other on the first channel portion and overlap the first gate electrode, respectively, and
the first channel portion overlaps a gap space between the first auxiliary gate electrode and the second auxiliary gate electrode.

2. The thin film transistor of clause 1, further comprising:
a first gate insulating layer between the first auxiliary gate electrode and the second auxiliary gate electrode and the first active layer; and
a second gate insulating layer between the first auxiliary gate electrode and the second auxiliary gate electrode and the first gate electrode,
wherein the first connection portion and the second connection portion are exposed from the first gate insulating layer and the second gate insulating layer, respectively.

3. The thin film transistor of clause 1 or 2, wherein the first auxiliary gate electrode, the second auxiliary gate electrode and the first gate electrode are configured to be applied with a same voltage.

4. The thin film transistor of any preceding clause, wherein the first auxiliary gate electrode overlaps the first channel portion at a side of the first channel portion nearest the first connection portion, and
the second auxiliary gate electrode overlaps the first channel portion at a side of the first channel portion nearest the second connection portion.

4A. The thin film transistor of any preceding clause, wherein the first auxiliary gate electrode overlaps the first channel portion in a direction of the first connection portion, and
the second auxiliary gate electrode overlaps the first channel portion in a direction of the second connection portion.

5. The thin film transistor of any preceding clause, wherein the gap space between the first auxiliary gate electrode and the second auxiliary gate electrode fully overlaps the first gate electrode on the first channel portion.

6. The thin film transistor of any preceding clause, wherein the first active layer includes a first semiconductor portion that is in contact with the first connection portion,
the first connection portion is disposed between the first channel portion and the first semiconductor portion and exposed from the first gate insulating layer, and
the first semiconductor portion is covered by the first gate insulating layer.

7. The thin film transistor of clause 6, further comprising a first electrode disposed on the same layer as the first gate electrode to contact the first connection portion,
wherein the first semiconductor portion overlaps the first electrode.

8. The thin film transistor of any preceding clause, wherein the first active layer includes a second semiconductor portion that is in contact with the second connection portion,
the second connection portion is disposed between the first channel portion and the second semiconductor portion and exposed from the first gate insulating layer, and
the second semiconductor portion is covered by the first gate insulating layer.

9. The thin film transistor of clause 8, further comprising a second electrode disposed on the same layer as the first gate electrode to contact the second connection portion,
wherein the second semiconductor portion overlaps the second electrode.

10. The thin film transistor of any preceding clause, further comprising a conductive material layer disposed on at least one of the first connection portion or the second connection portion,
wherein the conductive material layer does not overlap the first channel portion.

11. The thin film transistor of clause 10, wherein the conductive material layer includes at least one selected from titanium (Ti), molybdenum (Mo), aluminum (Al), silver (Ag), copper (Cu), chromium (Cr), tantalum (Ta), neodymium (Nd), calcium (Ca), barium (Ba) or a transparent conductive oxide (TCO).

12. A thin film transistor comprising:
a first active layer;
a first gate insulating layer on the first active layer;
a first auxiliary gate electrode on the first gate insulating layer;
a second gate insulating layer on the first auxiliary gate electrode; and
a first gate electrode on the second gate insulating layer,
wherein the first active layer includes:
a first channel portion;
a first connection portion that is in contact with a side of the first channel portion;
a first semiconductor portion that is in contact with the first connection portion;
a second connection portion that is in contact with the other side of the first channel portion; and
a second semiconductor portion that is in contact with the second connection portion,
the first connection portion is disposed between the first channel portion and the first semiconductor portion,
the second connection portion is disposed between the first channel portion and the second semiconductor portion,
the first connection portion and the second connection portion are exposed from the first gate insulating layer and the second gate insulating layer, respectively, and
the first semiconductor portion and the second semiconductor portion are covered by the first gate insulating layer and the second gate insulating layer, respectively.

13. The thin film transistor of clause 12, wherein the first auxiliary gate electrode overlaps the first gate electrode, and
the first channel portion includes an area that overlaps the first gate electrode and does not overlap the first auxiliary gate electrode.

14. The thin film transistor of clause 12 or 13, wherein the first auxiliary gate electrode overlaps the first channel portion at a side of the first channel portion nearest the first connection portion.

14A. The thin film transistor of clause 12 or 13, wherein the first auxiliary gate electrode overlaps the first channel portion in a direction of the first connection portion.

15. The thin film transistor of any of clauses 12 to 14A, wherein the first auxiliary gate electrode overlaps the first channel portion at a side of the first channel portion nearest the second connection portion.

15A. The thin film transistor of any of clauses 12 to 14A, wherein the first auxiliary gate electrode overlaps the first channel portion in a direction of the second connection portion 16. The thin film transistor of any of clauses 12 to 15A, further comprising:
a first electrode disposed on the same layer as the first gate electrode to contact the first connection portion; and
a second electrode spaced apart from the first electrode and disposed on the same layer as the first gate electrode to contact the second connection portion.

17. The thin film transistor of clause 16, wherein the first semiconductor portion overlaps the first electrode, and
the second semiconductor portion overlaps the second electrode.

18. A thin film transistor substrate comprising:
a first thin film transistor and a second thin film transistor on a base substrate,
wherein the first thin film transistor includes:
a first active layer having a first channel portion;
a first auxiliary gate electrode on the first active layer; and
a first gate electrode on the first auxiliary gate electrode,
the second thin film transistor includes:
a second active layer having a second channel portion; and
a second gate electrode that overlaps the second channel portion,
wherein the first auxiliary gate electrode is disposed between the first active layer and the first gate electrode and overlaps a portion of the first channel portion and a portion of the first gate electrode, and
the second gate electrode is disposed on the same layer as the first auxiliary gate electrode.

19. The thin film transistor substrate of clause 18, wherein the first active layer includes:
a first connection portion that is in contact with a side of the first channel portion; and
a second connection portion that is in contact with the other side of the first channel portion,
the second active layer includes:
a third connection portion that is in contact with one side of the second channel portion; and
a fourth connection portion that is in contact with the other side of the second channel portion.

20. The thin film transistor substrate of clause 19, further comprising:
a first gate insulating layer disposed between the first active layer and the first auxiliary gate electrode and between the second active layer and the second gate electrode; and
a second gate insulating layer disposed between the first auxiliary gate electrode and the first gate electrode,
wherein the first connection portion, the second connection portion, the third connection portion and the fourth connection portion are exposed from the first gate insulating layer and the second gate insulating layer, respectively.

21. The thin film transistor substrate of clause 20, wherein the first active layer includes a first semiconductor portion spaced apart from the first channel portion to contact the first connection portion and a second semiconductor portion spaced apart from the first channel portion to contact the second connection portion,
the second active layer includes a third semiconductor portion spaced apart from the second channel portion to contact the third connection portion and a fourth semiconductor portion spaced apart from the second channel portion to contact the fourth connection portion, and
the first semiconductor portion, the second semiconductor portion, the third semiconductor portion and the fourth semiconductor portion are covered by the first gate insulating layer, respectively.

22. The thin film transistor substrate of clause 21, further comprising:
a first electrode disposed on the same layer as the first gate electrode to contact the first connection portion;
a second electrode spaced apart from the first electrode and disposed on the same layer as the first gate electrode to contact the first connection portion;
a third electrode disposed on the same layer as the first gate electrode to contact the third connection portion; and
a fourth electrode spaced apart from the third electrode and disposed on the same layer as the first gate electrode to contact the fourth connection portion,
wherein the first semiconductor portion overlaps the first electrode,
the second semiconductor portion overlaps the second electrode,
the third semiconductor portion overlaps the third electrode, and
the fourth semiconductor portion overlaps the fourth electrode.

23. The thin film transistor substrate of any of clauses 19 to 22, wherein the first auxiliary gate electrode overlaps the first channel portion at a side of the first channel portion nearest the first connection portion.

23A. The thin film transistor substrate of any of clauses 19 to 22, wherein the first auxiliary gate electrode overlaps the channel portion in a direction of the first connection portion.

24. The thin film transistor substrate of any of clauses 19 to 23A, wherein the first auxiliary gate electrode overlaps the first channel portion at a side of the first channel portion nearest the second connection portion.

24A. The thin film transistor substrate of any of clauses 19 to 23A, wherein the first auxiliary gate electrode overlaps the channel portion in a direction of the second connection portion.

25. The thin film transistor substrate of any of clauses 18 to 24A, wherein the first thin film transistor further includes a second auxiliary gate electrode spaced apart from the first auxiliary gate electrode and disposed on the same layer as the first auxiliary gate electrode,
the first auxiliary gate electrode and the second auxiliary gate electrode overlap the first channel portion and the first gate electrode, respectively, and
the first channel portion overlaps a gap space between the first auxiliary gate electrode and the second auxiliary gate electrode.

26. The thin film transistor substrate of any of clauses 19 to 25, further comprising a conductive material layer disposed on the first connection portion, the second connection portion, the third connection portion and the fourth connection portion.

27. The thin film transistor substrate of any of clauses 18 to 26, wherein at least one of the first active layer or the second active layer includes an oxide semiconductor material.

28. The thin film transistor substrate of clause 27, wherein the oxide semiconductor material includes at least one of an IZO(InZnO)-based, IGO(InGaO)-based, ITO(InSnO)-based, IGZO(InGaZnO)-based, IGZTO(InGaZnSnO)- based, GZTO(GaZnSnO)-based, GZO(GaZnO)-based, ITZO(InSnZnO)-based or FIZO(FeInZnO)-based oxide semiconductor material.

29. The thin film transistor substrate of any of clauses 18 to 28, wherein at least one of the first active layer or the second active layer includes:
a first oxide semiconductor layer; and
a second oxide semiconductor layer on the first oxide semiconductor layer.

30. The thin film transistor substrate of clause 29, wherein at least one of the first active layer or the second active layer further includes a third oxide semiconductor layer on the second oxide semiconductor layer.

31. A display device comprising the thin film transistor of any one of clauses 1 to 17.

32. A display device comprising the thin film transistor substrate of any one of clauses 18 to 30.

It will be apparent to those skilled in the art that various modifications and variations can be made in the thin film transistor, the thin film transistor substrate, and the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A thin film transistor comprising:
a first active layer;
a first gate insulating layer on the first active layer;
a first auxiliary gate electrode on the first gate insulating layer;
a second gate insulating layer on the first auxiliary gate electrode; and
a first gate electrode on the second gate insulating layer,
wherein the first active layer includes:
a first channel portion;
a first connection portion that is in contact with a side of the first channel portion;
a first semiconductor portion that is in contact with the first connection portion;
a second connection portion that is in contact with the other side of the first channel portion; and
a second semiconductor portion that is in contact with the second connection portion,
wherein the first connection portion is disposed between the first channel portion and the first semiconductor portion,
the second connection portion is disposed between the first channel portion and the second semiconductor portion,
the first connection portion and the second connection portion are exposed from the first gate insulating layer and the second gate insulating layer, respectively, and
the first semiconductor portion and the second semiconductor portion are covered by the first gate insulating layer and the second gate insulating layer, respectively.

2. The thin film transistor of claim 1, wherein the first auxiliary gate electrode overlaps the first gate electrode, and the first channel portion includes an area that overlaps the first gate electrode and does not overlap the first auxiliary gate electrode.

3. The thin film transistor of claim 1, wherein the first auxiliary gate electrode overlaps the first channel portion at a side of the first channel portion nearest the first connection portion.

4. The thin film transistor of claim 1, wherein the first auxiliary gate electrode overlaps the first channel portion at a side of the first channel portion nearest the second connection portion.

5. The thin film transistor of claim 1, further comprising:
a first electrode disposed on the same layer as the first gate electrode to contact the first connection portion; and
a second electrode spaced apart from the first electrode and disposed on the same layer as the first gate electrode to contact the second connection portion.

6. The thin film transistor of claim 5, wherein the first semiconductor portion overlaps the first electrode, and
the second semiconductor portion overlaps the second electrode.

7. A display device comprising the thin film transistor of claim 1.

8. A thin film transistor comprising:
a first active layer;
a first gate electrode at least partially overlapped with the first active layer; and
a first auxiliary gate electrode and a second auxiliary gate electrode between the first active layer and the first gate electrode,
wherein the first active layer includes:
a first channel portion;
a first connection portion that is in contact with a side of the first channel portion; and
a second connection portion that is in contact with the other side of the first channel portion,
wherein the first channel portion overlaps the first auxiliary gate electrode, the second auxiliary gate electrode and the first gate electrode,
the first auxiliary gate electrode and the second auxiliary gate electrode are spaced apart from each other on the first channel portion and each at least partially overlap the first gate electrode, and
the first channel portion overlaps a gap between the first auxiliary gate electrode and the second auxiliary gate electrode.

9. The thin film transistor of claim 8, further comprising:
a first gate insulating layer between the first auxiliary gate electrode and the second auxiliary gate electrode and the first active layer; and
a second gate insulating layer between the first auxiliary gate electrode and the second auxiliary gate electrode and the first gate electrode,
wherein the first connection portion and the second connection portion are exposed from the first gate insulating layer and the second gate insulating layer, respectively.

10. The thin film transistor of claim 8, wherein the first auxiliary gate electrode, the second auxiliary gate electrode and the first gate electrode are configured to be applied with a same voltage.

11. The thin film transistor of claim 8, wherein the first auxiliary gate electrode overlaps the first channel portion at a side of the first channel portion nearest the first connection portion, and
the second auxiliary gate electrode overlaps the first channel portion at a side of the first channel portion nearest the second connection portion.

12. The thin film transistor of claim 8, wherein the gap space between the first auxiliary gate electrode and the second auxiliary gate electrode fully overlaps the first gate electrode on the first channel portion.

13. The thin film transistor of claim 8, wherein the first active layer includes a first semiconductor portion that is in contact with the first connection portion,
  the first connection portion is disposed between the first channel portion and the first semiconductor portion and exposed from the first gate insulating layer, and
  the first semiconductor portion is covered by the first gate insulating layer.

14. The thin film transistor of claim 13, further comprising a first electrode disposed on the same layer as the first gate electrode to contact the first connection portion,
  wherein the first semiconductor portion overlaps the first electrode.

15. The thin film transistor of claim 8, wherein the first active layer includes a second semiconductor portion that is in contact with the second connection portion,
  the second connection portion is disposed between the first channel portion and the second semiconductor portion and exposed from the first gate insulating layer, and
  the second semiconductor portion is covered by the first gate insulating layer.

16. The thin film transistor of claim 15, further comprising a second electrode disposed on the same layer as the first gate electrode to contact the second connection portion,
  wherein the second semiconductor portion overlaps the second electrode.

17. The thin film transistor of claim 8, further comprising a conductive material layer disposed on at least one of the first connection portion or the second connection portion,
  wherein the conductive material layer does not overlap the first channel portion.

18. The thin film transistor of claim 17, wherein the conductive material layer includes at least one selected from titanium (Ti), molybdenum (Mo), aluminum (Al), silver (Ag), copper (Cu), chromium (Cr), tantalum (Ta), neodymium (Nd), calcium (Ca), barium (Ba) or a transparent conductive oxide (TCO).

* * * * *